(12) United States Patent
Nihei et al.

(10) Patent No.: US 12,453,095 B2
(45) Date of Patent: Oct. 21, 2025

(54) SEMICONDUCTOR STORAGE DEVICE

(71) Applicant: Kioxia Corporation, Tokyo (JP)

(72) Inventors: Ryota Nihei, Yokkaichi Mie (JP); Koji Matsuo, Ama Aichi (JP)

(73) Assignee: Kioxia Corporation, Tokyo (JP)

( * ) Notice: Subject to any disclaimer, the term of this patent is extended or adjusted under 35 U.S.C. 154(b) by 331 days.

(21) Appl. No.: 18/178,460

(22) Filed: Mar. 3, 2023

(65) Prior Publication Data

US 2024/0098995 A1 Mar. 21, 2024

(30) Foreign Application Priority Data

Sep. 15, 2022 (JP) ................................. 2022-147219

(51) Int. Cl.
*H10B 43/20* (2023.01)
*H10B 43/10* (2023.01)
*H10B 43/27* (2023.01)
*H10B 43/35* (2023.01)

(52) U.S. Cl.
CPC ............. *H10B 43/27* (2023.02); *H10B 43/10* (2023.02); *H10B 43/35* (2023.02)

(58) Field of Classification Search
CPC ..................................................... H10B 43/20
See application file for complete search history.

(56) References Cited

U.S. PATENT DOCUMENTS

| 8,779,499 | B2 | 7/2014 | Kiyotoshi |
| 10,985,251 | B2 | 4/2021 | Lee |
| 2011/0233645 | A1 | 9/2011 | Iinuma |
| 2012/0280303 | A1 | 11/2012 | Kiyotoshi |
| 2018/0083026 | A1* | 3/2018 | Matsuo ................. H10B 43/10 |

FOREIGN PATENT DOCUMENTS

| JP | 2011204773 A | 10/2011 |
| JP | 2012227326 A | 11/2012 |
| JP | 2012234980 A | 11/2012 |

* cited by examiner

*Primary Examiner* — Christopher A Johnson
(74) *Attorney, Agent, or Firm* — Kim & Stewart LLP

(57) ABSTRACT

According to one embodiment, a semiconductor storage device has first and second gate electrodes extending in one direction. A first semiconductor layer is between the first gate electrode and the second gate electrode. A second semiconductor layer is also between the first semiconductor layer and the second gate electrode but separated from the first semiconductor layer. A third semiconductor layer is between the first gate electrode and the second gate electrode but is spaced from the first semiconductor layer by a gap. A first charge trapping layer is between the first gate electrode and the first semiconductor layer. A second charge trapping layer is between the second gate electrode and the second semiconductor layer. A third charge trapping layer is between the first gate electrode and the third semiconductor layer.

20 Claims, 21 Drawing Sheets

BB' CROSS-SECTION

CC' CROSS-SECTION

BB' CROSS-SECTION

CC' CROSS-SECTION

SEMICONDUCTOR STORAGE DEVICE

CROSS-REFERENCE TO RELATED APPLICATION(S)

This application is based upon and claims the benefit of priority from Japanese Patent Application No. 2022-147219, filed Sep. 15, 2022, the entire contents of which are incorporated herein by reference.

FIELD

Embodiments described herein relate generally to a semiconductor storage device.

BACKGROUND

A NAND flash memory in which memory cells are arranged three-dimensionally (three-dimensional NAND flash memory) provides a high degree of integration and low cost. The degree of integration can be increased still further by miniaturizing the memory cells in the three-dimensional NAND flash memory. However, when the memory cells are made smaller, inter-cell interference between neighboring memory cells tends to increase, and there is concern about appropriate functioning of the three-dimensional NAND flash memory and operations becoming unstable.

DETAILED DESCRIPTION

Figure 1:
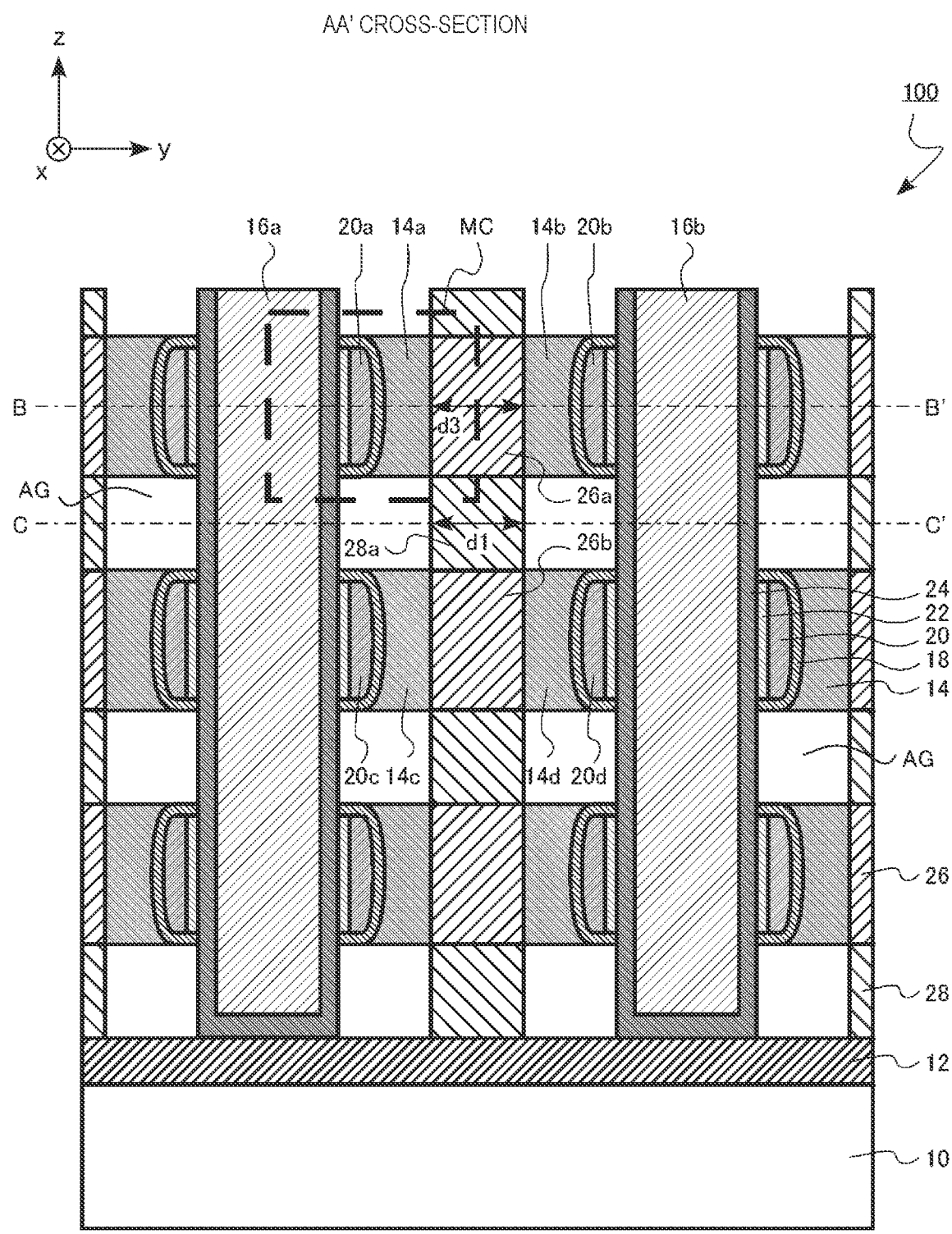
FIG. 1 is a schematic cross-sectional view of a semiconductor storage device of an embodiment.

In general, according to one embodiment, a semiconductor storage device includes a first gate electrode layer extending in a first direction and a second gate electrode layer extending in the first direction. A first semiconductor layer extends in a second direction intersecting the first direction. The first semiconductor layer is between the first gate electrode layer and the second gate electrode layer in a third direction intersecting the first and second directions. A second semiconductor layer extends in the second direction. The second semiconductor layer is between the first semiconductor layer and the second gate electrode layer in the third direction and separated from the first semiconductor layer. A third semiconductor layer is between the first gate electrode layer and the second gate electrode layer in the third direction. The third semiconductor layer extends in the second direction and is spaced from the first semiconductor layer in the first direction by a first gap. A first charge trapping layer is between the first gate electrode layer and the first semiconductor layer. A second charge trapping layer is between the second gate electrode layer and the second semiconductor layer. A third charge trapping layer is between the first gate electrode layer and the third semiconductor layer.

Hereafter, certain example embodiments of the present disclosure will be described with reference to the drawings. In the following description, identical reference signs are allotted to identical or substantially similar components, members, aspects or the like, and a description of such components, members, aspects or the like may be omitted after a prior description.

Also, the term "up" or "down" may be used in the specification as appropriate for descriptive convenience. The term "up" or "down" is, for example, a term indicating a relative positional relationship in a drawing. The terms "up" or "down" and the like are not necessarily terms stipulating a positional relationship with respect to gravity.

Qualitative analysis and quantitative analysis of a chemical composition of a material, member, component, region, or the like configuring a semiconductor storage device described in the specification may be carried out using, for example, secondary ion mass spectrometry (SIMS) and energy dispersive x-ray spectroscopy (EDX). Also, for example, a transmission electron microscope (TEM) may be used to measure a thickness of a member configuring a semiconductor storage device, a distance between members, and the like.

A semiconductor storage device of one embodiment includes a substrate, a first gate electrode layer extending in a first direction that intersects a surface of the substrate, a second gate electrode layer extending in the first direction, a first semiconductor layer that is provided between the first gate electrode layer and the second gate electrode layer and extends in a second direction that follows the surface of the substrate, a second semiconductor layer that is provided between the first semiconductor layer and the second gate electrode layer, is separated from the first semiconductor layer, and extends in the second direction, a third semiconductor layer that is provided between the first gate electrode layer and the second gate electrode layer, is provided in the first direction with respect to the first semiconductor layer, extends in the second direction, and is separated from the first semiconductor layer by a gap, a first charge trapping layer that is provided between the first gate electrode layer and the first semiconductor layer, a second charge trapping layer that is provided between the second gate electrode layer and the second semiconductor layer, and a third charge trapping layer that is provided between the first gate electrode layer and the third semiconductor layer.

Also, a semiconductor storage device of an embodiment includes a first gate electrode layer extending in a first direction, a second gate electrode layer extending in the first direction, a third gate electrode layer that extends in the first direction and is separated from the first gate electrode layer by a gap, a first semiconductor layer that is provided between the first gate electrode layer and the second gate electrode layer, is provided between the third gate electrode layer and the second gate electrode layer, and extends in a second direction that intersects the first direction, a second semiconductor layer that is provided between the first semiconductor layer and the second gate electrode layer, is separated from the first semiconductor layer, and extends in the second direction, a third semiconductor layer that is provided between the first gate electrode layer and the second gate electrode layer, is provided between the third gate electrode layer and the second gate electrode layer, is provided in the first direction with respect to the first semiconductor layer, extends in the second direction, and is separated from the first semiconductor layer by a gap, a fourth semiconductor layer that is provided between the third semiconductor layer and the second gate electrode layer, is separated from the third semiconductor layer, extends in the second direction, and is separated from the second semiconductor layer by a gap, a first charge trapping layer that is provided between the first gate electrode layer and the first semiconductor layer, a second charge trapping layer that is provided between the second gate electrode layer and the second semiconductor layer, a third charge trapping layer that is provided between the first gate electrode layer and the third semiconductor layer, a fourth charge trapping layer that is provided between the second gate electrode layer and the fourth semiconductor layer, and a fifth charge trapping layer that is provided between the third gate electrode layer and the first semiconductor layer.

The semiconductor storage device of the present embodiment is a three-dimensional NAND flash memory. The semiconductor storage device of this embodiment is such that multiple semiconductor layers extending in a direction parallel to a surface of a semiconductor substrate are stacked one on the other on the semiconductor substrate. A memory cell is formed at a portion in which a gate electrode layer, extending in a direction that intersects with the surface of the semiconductor substrate, meets (intersects) a semiconductor layer. A memory cell of the semiconductor storage device of this example embodiment is a so-called floating gate type of memory cell.

Figure 2A:
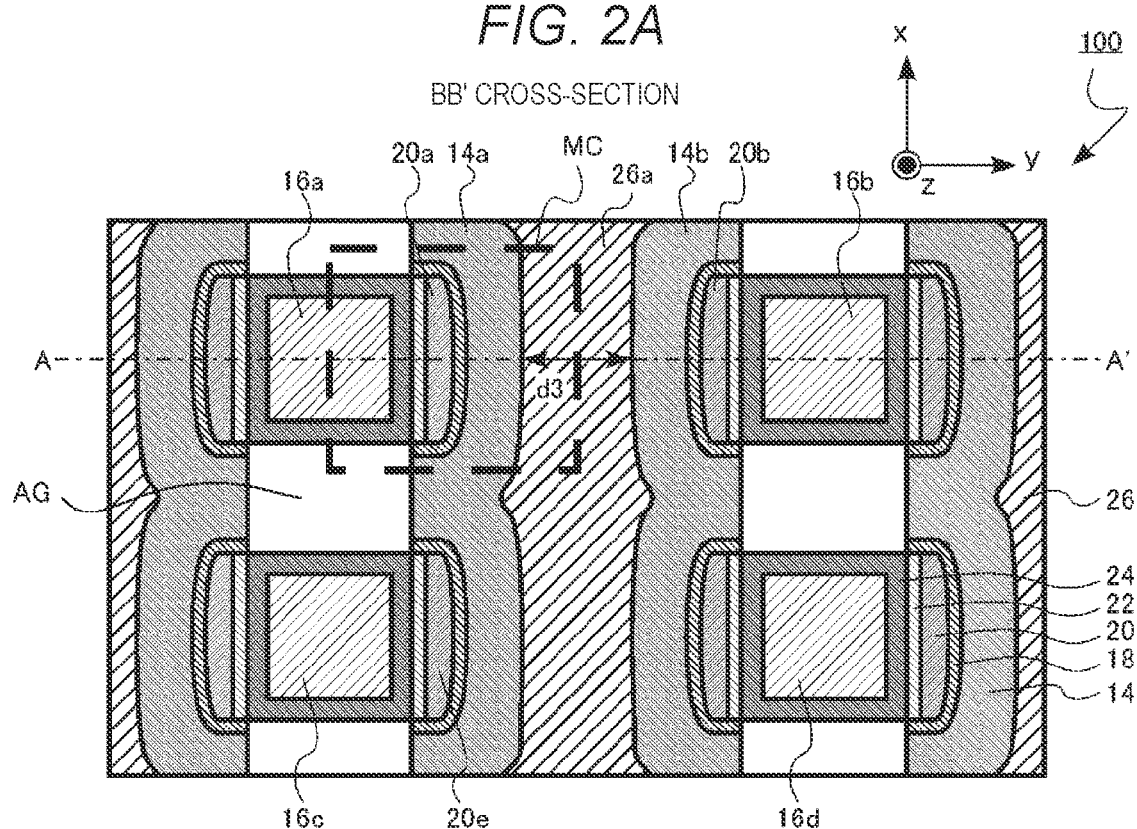
FIGS. 2A and 2B are each schematic cross-sectional views of a semiconductor storage device of an embodiment.
Figure 2B:
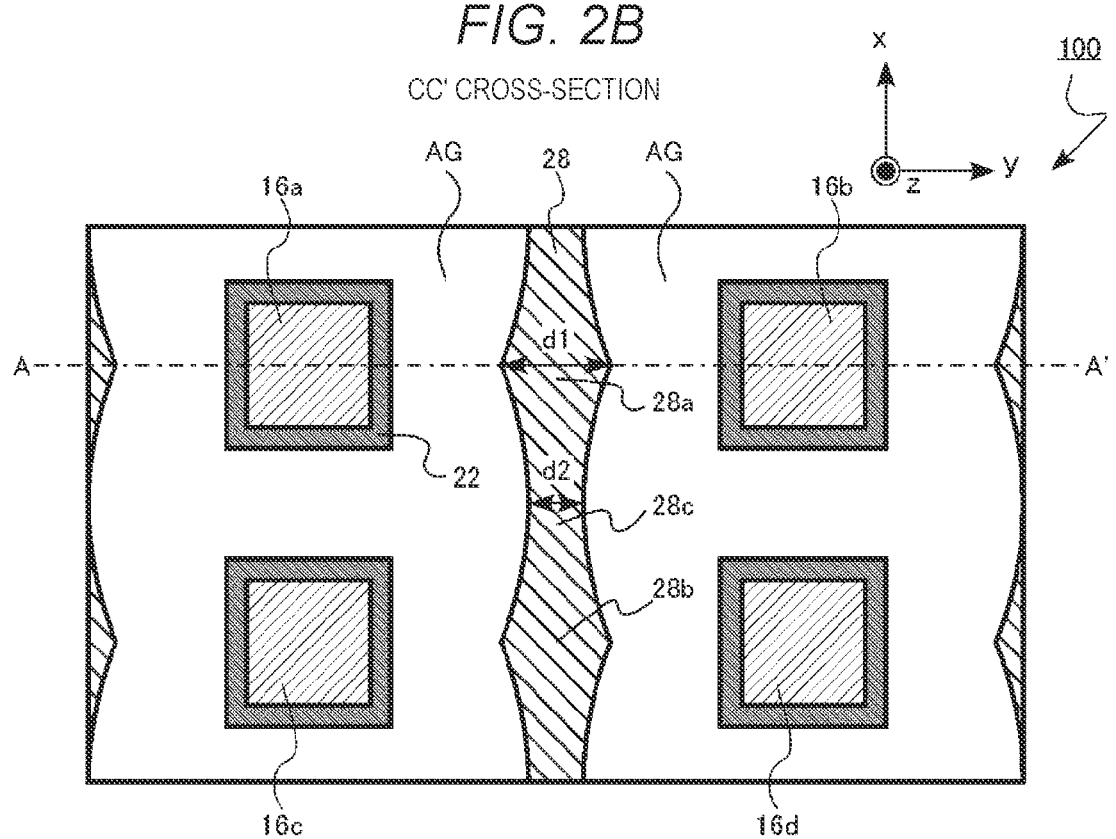

FIGS. 1, 2A, and 2B are schematic cross-sectional views of a semiconductor storage device 100 (also referred to as flash memory 100) of the embodiment.

The flash memory 100 includes a peripheral circuit (not separately depicted). The peripheral circuit is implemented by, for example, a CMOS circuit, and provides a function of controlling the operations of the memory cell array.

FIG. 1 is an AA' cross-section of FIGS. 2A and 2B. FIG. 2A is a BB' cross-section of FIG. 1. FIG. 2B is a CC' cross-section of FIG. 1. A region enclosed by broken lines in FIGS. 1 and 2A is one memory cell MC.

FIG. 1 is a yz cross-section of a memory cell array. FIGS. 2A and 2B are xy cross-sections of a memory cell array.

The flash memory 100 includes a semiconductor substrate 10, a substrate insulating layer 12, semiconductor layers 14, gate electrode layers 16, a tunnel insulating film 18, charge trapping layers 20, a first block insulating film 22, a second block insulating film 24, a first interlayer insulating layer 26, and a second interlayer insulating layer 28.

The semiconductor layers 14 include a first semiconductor layer 14a, a second semiconductor layer 14b, a third semiconductor layer 14c, and a fourth semiconductor layer 14d. The gate electrode layers 16 include a first gate electrode layer 16a, a second gate electrode layer 16b, a third gate electrode layer 16c, and a fourth gate electrode layer 16d. The charge trapping layers 20 include a first charge trapping layer 20a, a second charge trapping layer 20b, a third charge trapping layer 20c, a fourth charge trapping layer 20d, and a fifth charge trapping layer 20e. The first interlayer insulating layer 26 comprises a first insulating layer 26a and a second insulating layer 26b.

The second interlayer insulating layer 28 is an example of the third insulating layer. The second interlayer insulating layer 28 includes a first portion 28a, a second portion 28b, and a third portion 28c.

The semiconductor substrate 10 is, for example, monocrystalline silicon. The semiconductor substrate 10 is, for example, a silicon substrate. The semiconductor substrate 10 has surfaces that are parallel in the x direction and the y direction. A direction perpendicular to a surface of the semiconductor substrate 10 is the z direction.

The substrate insulating layer 12 is provided on the semiconductor substrate 10. The substrate insulating layer 12 comprises, for example, aluminum oxide or silicon oxide. The substrate insulating layer 12 is, for example, an aluminum oxide layer or a silicon oxide layer.

The semiconductor layer 14 is provided on the substrate insulating layer 12. The semiconductor layer 14 extends in a direction along a surface of the semiconductor substrate 10. The semiconductor layer 14 extends in the x direction parallel to a surface of the semiconductor substrate 10.

A semiconductor layer 14 is disposed repeatedly in the z direction. The semiconductor layers 14 are also disposed repeatedly in the y direction.

Pairs of semiconductor layers 14 neighboring each other in the z direction are separated by a gap AG. A gap AG is between each pair of semiconductor layers 14 neighboring (adjacent) in the z direction. The two semiconductor layers 14 neighboring in the z direction are electrically separated by the gap AG. The gap AG is void space. That is, gap AG is substantially empty space filled only with gaseous material.

The semiconductor layer 14 functions as a channel of a transistor of the memory cell MC.

The semiconductor layer 14 is, for example, a monocrystalline semiconductor. The semiconductor layer 14 includes, for example, monocrystalline silicon. The semiconductor layer 14 is, for example, a monocrystalline silicon layer. A thickness in the z direction of the semiconductor layer 14 is, for example, 5 nm or greater, 30 nm or less.

The gate electrode layer 16 extends in the z direction. Two neighboring gate electrode layers 16 are separated by the gap AG. The gap AG is between neighboring gate electrode layers 16.

For example, two gate electrode layers 16 neighboring each other in the x direction are also separated by a gap AG, as shown in FIGS. 2A and 2B. Also, for example, two gate electrode layers 16 neighboring each other in the y direction are separated by gaps AG, as shown in FIG. 2B. These gaps AG are not necessarily all connected to each other with respect to fluid communication between different gaps AG. FIG. 2B shows that two gaps AG, separated from each other by second interlayer insulating layer 28, are present between neighboring gate electrode layers 16 in the y direction.

As shown in FIG. 2B, one portion of the gate electrode layer 16 is enclosed (surrounded) by the gap AG. Neighboring gate electrode layers 16 are electrically separated by the gap AG.

Each gate electrode layer 16 functions as a gate electrode of a memory cell transistor of the memory cell MC.

The gate electrode layer 16 is a columnar conductor. The gate electrode layer 16 includes, for example, a metal.

The gate electrode layer 16 includes, for example, tungsten (W). The gate electrode layer 16 is, for example, a tungsten metal layer.

The tunnel insulating film 18 is provided between the semiconductor layer 14 and the gate electrode layer 16. The tunnel insulating film 18 is also between the semiconductor layer 14 and the charge trapping layer 20. The tunnel insulating film 18 is in contact with the semiconductor layer 14. The tunnel insulating film 18 is in contact with the charge trapping layer 20.

The tunnel insulating film 18 has a function of allowing a charge to pass in accordance with a voltage applied between the gate electrode layer 16 and the semiconductor layer 14.

The tunnel insulating film 18 comprises, for example, silicon oxide, silicon nitride, or silicon oxynitride. The tunnel insulating film 18 is, for example, a silicon oxide film. The tunnel insulating film 18 is, for example, a silicon thermal oxide film.

The charge trapping layer 20 is provided between the tunnel insulating film 18 and the gate electrode layer 16. The charge trapping layer 20 is provided between the tunnel insulating film 18 and the first block insulating film 22. The charge trapping layer 20 is in contact with the tunnel insulating film 18. The charge trapping layer 20 is in contact with the first block insulating film 22.

Pairs of charge trapping layers 20 neighboring each other in the z direction are separated by the gap AG. The gap AG is between each pair of charge trapping layers 20 neighboring in the z direction.

The charge trapping layer 20 has a function of storing a charge. The charge is, for example, electrons. A memory cell transistor threshold voltage changes in accordance with an amount of charge stored in the charge trapping layer 20. By utilizing this threshold voltage change, one memory cell MC can store data. When the amount of charge stored in the charge trapping layer 20 increases, an amount of change in the threshold voltage increases.

For example, owing to the memory cell transistor threshold voltage changing, a voltage at which the memory cell transistor comes on changes. For example, when a state in which the threshold voltage is high is defined as data "0" and a state in which the threshold voltage is low is defined as data "1", the memory cell can store 1-bit data of "0" and "1".

The charge trapping layer 20 is, for example, a conductor. The charge trapping layer 20 includes, for example, monocrystalline silicon. The charge trapping layer 20 is, for example, a monocrystalline silicon layer.

The first block insulating film 22 is provided between the charge trapping layer 20 and the gate electrode layer 16. The first block insulating film 22 is also provided between the charge trapping layer 20 and the second block insulating film 24. The first block insulating film 22 is in contact with the charge trapping layer 20. The first block insulating film 22 is also in contact with the second block insulating film 24.

The first block insulating film 22 has a function of blocking a current flowing between the charge trapping layer 20 and the gate electrode layer 16.

The first block insulating film 22 is, for example, an oxide, an oxynitride, or a nitride. The first block insulating film 22 includes, for example, silicon oxide. The first block insulating film 22 is, for example, a silicon oxide film.

The second block insulating film 24 is provided between the charge trapping layer 20 and the gate electrode layer 16. The second block insulating film 24 is provided between the first block insulating film 22 and the gate electrode layer 16. The second block insulating film 24 is in contact with the gate electrode layer 16.

The second block insulating film 24 has a function of blocking a current flowing between the charge trapping layer 20 and the gate electrode layer 16.

The second block insulating film 24 is, for example, an oxide, an oxynitride, or a nitride. The second block insulating film 24 has a chemical composition differing from that of the first block insulating film 22. The second block insulating film 24 includes, for example, aluminum oxide. The second block insulating film 24 is, for example, an aluminum oxide film.

The first interlayer insulating layer 26 is provided between pairs of gate electrode layers 16 neighboring in the y direction. The first interlayer insulating layer 26 is provided between pairs of semiconductor layers 14 neighboring in the y direction. The first interlayer insulating layer 26 is disposed repeatedly in the z direction.

The first interlayer insulating layer 26 has a function of electrically separating semiconductor layers 14 neighboring in the y direction.

The first interlayer insulating layer 26 is, for example, an oxide, an oxynitride, or a nitride. The first interlayer insulating layer 26 includes, for example, silicon oxide. The first interlayer insulating layer 26 is, for example, a silicon oxide layer. A thickness in the z direction of the first interlayer insulating layer 26 is, for example, 5 nm or greater, 30 nm or less.

The second interlayer insulating layer 28 is provided between pairs of gate electrode layers 16 neighboring in the y direction. The second interlayer insulating layer 28 is provided between first interlayer insulating layers 26 neighboring in the z direction. The second interlayer insulating layer 28 is disposed repeatedly in the z direction.

The second interlayer insulating layer 28 has a function of mechanically supporting first interlayer insulating layers 26 neighboring in the z direction. The second interlayer insulating layer 28 has a function of maintaining the gap AG between semiconductor layers 14 neighboring in the z direction.

The second interlayer insulating layer 28 is, for example, an oxide, an oxynitride, or a nitride. The second interlayer insulating layer 28 has a chemical composition differing from that of the first interlayer insulating layer 26. The second interlayer insulating layer 28 is formed of a material differing from that of the first interlayer insulating layer 26.

The second interlayer insulating layer 28 includes, for example, silicon nitride. The second interlayer insulating layer 28 is, for example, a silicon nitride layer. A thickness in the z direction of the second interlayer insulating layer 28 is, for example, 5 nm or greater, 30 nm or less.

The first semiconductor layer 14a is provided between the first gate electrode layer 16a and the second gate electrode layer 16b. The second gate electrode layer 16b is provided in the y direction of the first gate electrode layer 16a. As shown in FIG. 2B, the second gate electrode layer 16b is separated from the first gate electrode layer 16a by the gap AG.

The second semiconductor layer 14b is provided between the first gate electrode layer 16a and the second gate electrode layer 16b. The second gate electrode layer 16b is provided in the y direction of the first semiconductor layer 14a. The second semiconductor layer 14b is provided between the first semiconductor layer 14a and the second gate electrode layer 16b. The second semiconductor layer 14b is separated from the first semiconductor layer 14a.

The third semiconductor layer 14c is provided between the first gate electrode layer 16a and the second gate electrode layer 16b. The third semiconductor layer 14c is provided in the z direction with respect to the first semiconductor layer 14a. As shown in FIG. 1, the third semiconductor layer 14c is separated from the first semiconductor layer 14a by the gap AG.

The fourth semiconductor layer 14d is provided between the first gate electrode layer 16a and the second gate electrode layer 16b. The fourth semiconductor layer 14d is provided between the third semiconductor layer 14c and the second gate electrode layer 16b. The fourth semiconductor layer 14d is separated from the third semiconductor layer 14c.

The third gate electrode layer 16c is provided in the x direction of the first gate electrode layer 16a. As shown in FIGS. 2A and 2B, the third gate electrode layer 16c is separated from the first gate electrode layer 16a by the gap AG.

The fourth gate electrode layer 16d is provided in the x direction of the second gate electrode layer 16b. The fourth gate electrode layer 16d is provided in the y direction of the third gate electrode layer 16c. As shown in FIGS. 2A and 2B, the fourth gate electrode layer 16d is separated from the second gate electrode layer 16b by the gap AG.

The first semiconductor layer 14a, the second semiconductor layer 14b, the third semiconductor layer 14c, and the fourth semiconductor layer 14d are provided between the third gate electrode layer 16c and the fourth gate electrode layer 16d.

The first charge trapping layer 20a is provided between the first gate electrode layer 16a and the first semiconductor layer 14a. The second charge trapping layer 20b is provided between the second gate electrode layer 16b and the second semiconductor layer 14b. The third charge trapping layer 20c is provided between the first gate electrode layer 16a and the third semiconductor layer 14c. The fourth charge trapping layer 20d is provided between the second gate electrode layer 16b and the fourth semiconductor layer 14d. The fifth charge trapping layer 20e is provided between the third gate electrode layer 16c and the first semiconductor layer 14a.

As shown in FIG. 1, the first charge trapping layer 20a and the third charge trapping layer 20c are separated by the gap AG. The gap AG is between the first charge trapping layer 20a and the third charge trapping layer 20c.

As shown in FIG. 1, the second charge trapping layer 20b and the fourth charge trapping layer 20d are separated by the gap AG. The gap AG is between the second charge trapping layer 20b and the fourth charge trapping layer 20d.

As shown in FIGS. 1 and 2A, the first insulating layer 26a of the first interlayer insulating layer 26 is provided between the first semiconductor layer 14a and the second semiconductor layer 14b. The first insulating layer 26a electrically separates the first semiconductor layer 14a and the second semiconductor layer 14b.

As shown in FIG. 1, the second insulating layer 26b of the first interlayer insulating layer 26 is provided between the third semiconductor layer 14c and the fourth semiconductor layer 14d. The second insulating layer 26b electrically separates the third semiconductor layer 14c and the fourth semiconductor layer 14d.

As shown in FIG. 1, the second interlayer insulating layer 28 is provided between the first insulating layer 26a and the second insulating layer 26b. As shown in FIG. 2B, the second interlayer insulating layer 28 is separated from the first gate electrode layer 16a by the gap AG. The second interlayer insulating layer 28 is separated from the second gate electrode layer 16b by the gap AG.

The second interlayer insulating layer 28 includes the first portion 28a, the second portion 28b, and the third portion 28c. As shown in FIG. 2B, the first portion 28a is provided between the first gate electrode layer 16a and the second gate electrode layer 16b. Also, the second portion 28b is provided between the third gate electrode layer 16c and the fourth gate electrode layer 16d. The third portion 28c is provided between the first portion 28a and the second portion 28b.

A width of the first portion 28a in the y direction from the first gate electrode layer 16a toward the second gate electrode layer 16b (d1 in FIGS. 1 and 2B) is greater than a width in the y direction of the third portion 28c (d2 in FIG. 2B). The width d1 in the y direction of the first portion 28a is, for example, 1.2 times or more than the width d2 in the y direction of the third portion 28c.

The width of the first portion 28a in the y direction (d1 in FIGS. 1 and 2B) is preferably smaller than a distance in the y direction between the first semiconductor layer 14a and the second semiconductor layer 14b (d3 in FIGS. 1 and 2A). The width d1 in the y direction of the first portion 28a is, for example, 0.8 times or less the distance d3 in the y direction between the first semiconductor layer 14a and the second semiconductor layer 14b.

Next, one example of a method of manufacturing the semiconductor storage device of the embodiment will be described.

FIGS. 3A to 19B are schematic sectional views showing a method of manufacturing the semiconductor storage device of the embodiment. FIGS. 3A, 4A, 5A, 6A, 7A, 8A, 9A, 10A, 11A, 12A, 13A, 14A, 15A, 16A, 17A, 18A, and 19A each show a cross-section corresponding to FIG. 2A. FIGS. 3B, 4B, 5B, 6B, 7B, 8B, 9B, 10B, 11B, 12B, 13B, 14B, 15B, 16B, 17B, 18B, and 19B each show a cross-section corresponding to one portion of FIG. 1.

Figure 3A:
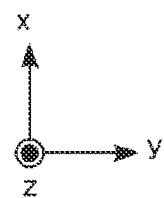
FIGS. 3A to 19B are schematic cross-sectional views depicting aspects of a method of manufacturing a semiconductor storage device of an embodiment.
Figure 3A:
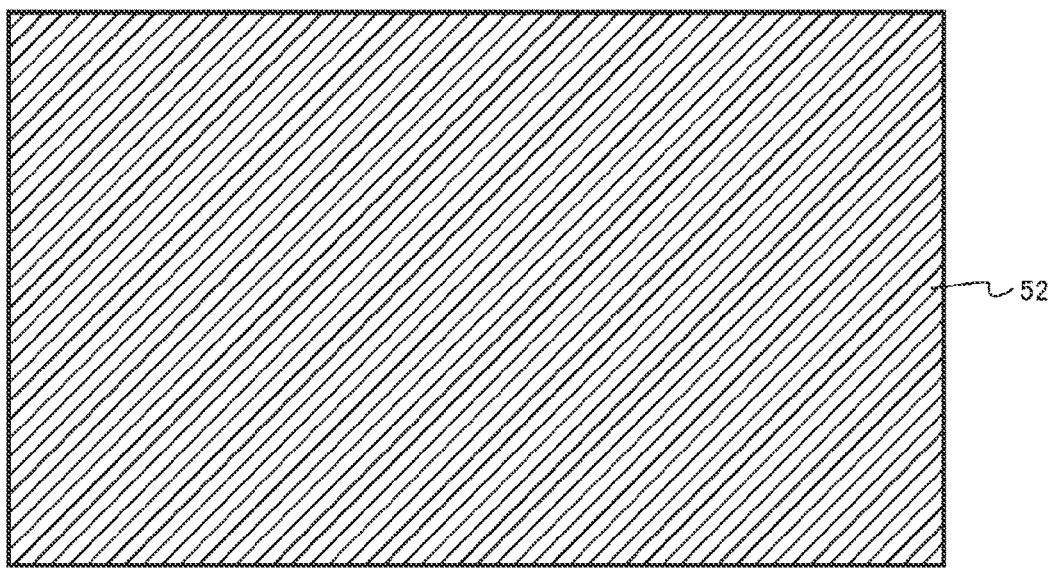
Figure 3B:
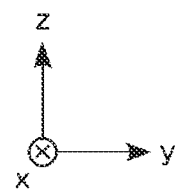
Figure 3B:
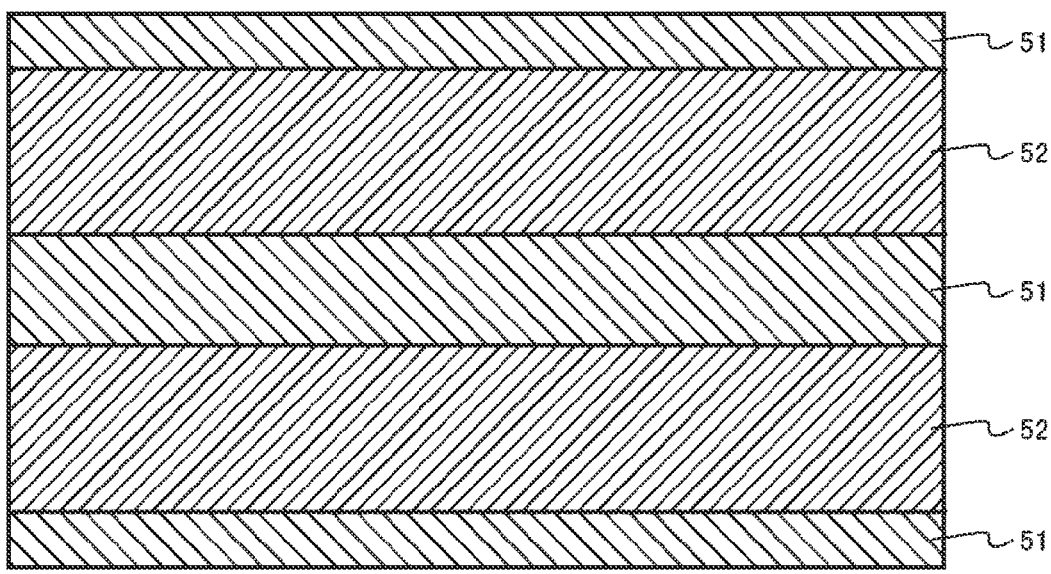

Firstly, a multiple of silicon nitride layers 51 and a multiple of silicon oxide layers 52 are stacked alternately on a substrate (FIGS. 3A and 3B).

The silicon nitride layer 51 and the silicon oxide layer 52 are formed using, for example, a chemical vapor deposition method (CVD method).

One portion of the silicon nitride layer 51 eventually becomes the second interlayer insulating layer 28. One portion of the silicon oxide layer 52 eventually becomes the first interlayer insulating layer 26.

Figure 4A:
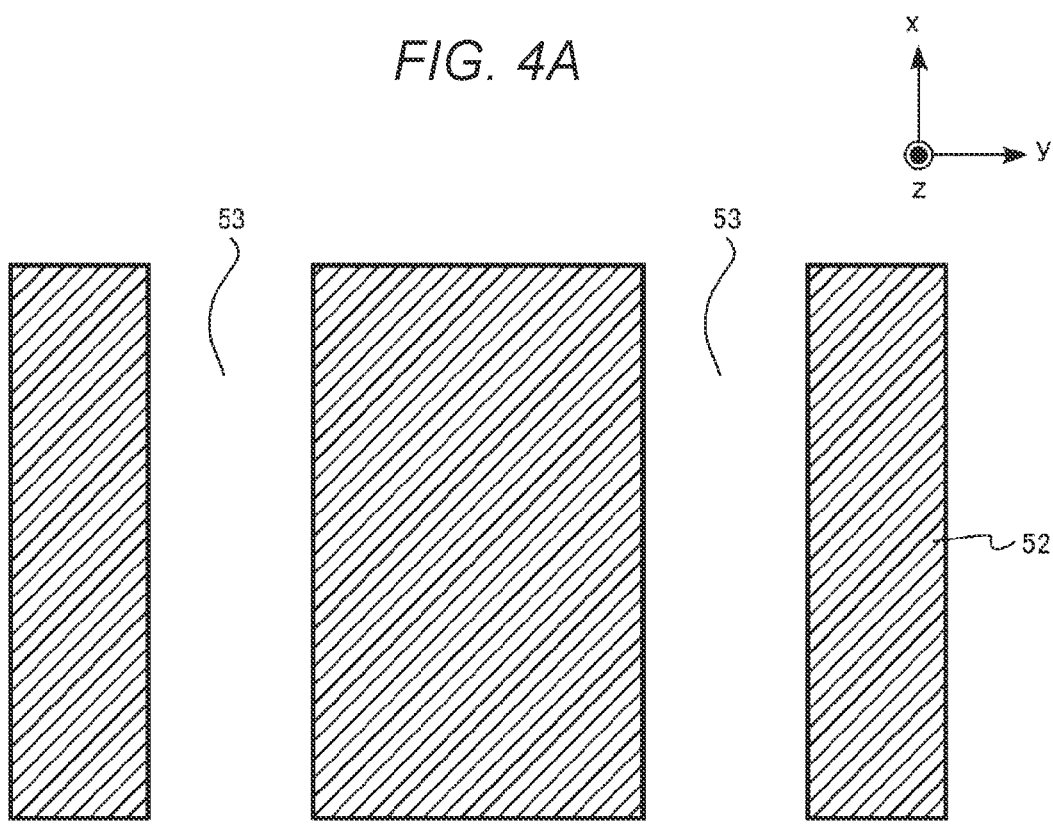
Figure 4B:
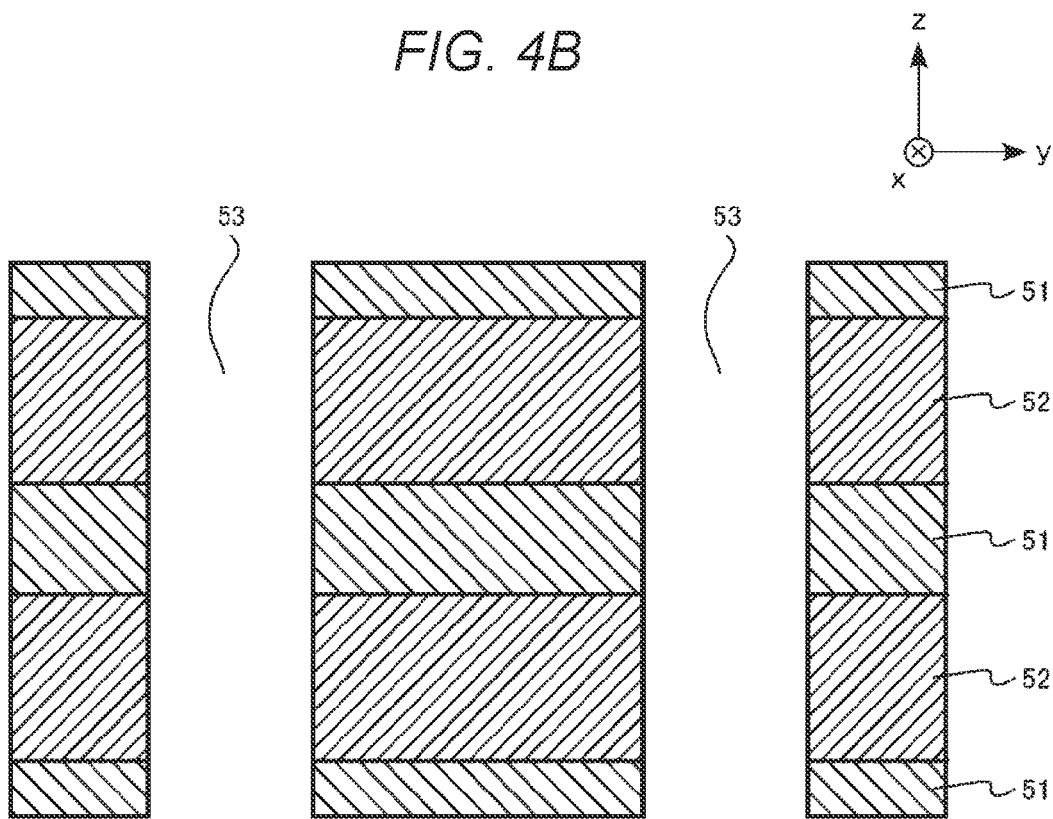

Next, a first aperture portion 53 that penetrates the silicon nitride layer 51 and the silicon oxide layer 52 is formed (FIGS. 4A and 4B). The first aperture portion 53 is formed using, for example, lithography and a reactive ion etching method (RIE method). The first aperture portion 53 extends in the x direction.

Figure 5A:
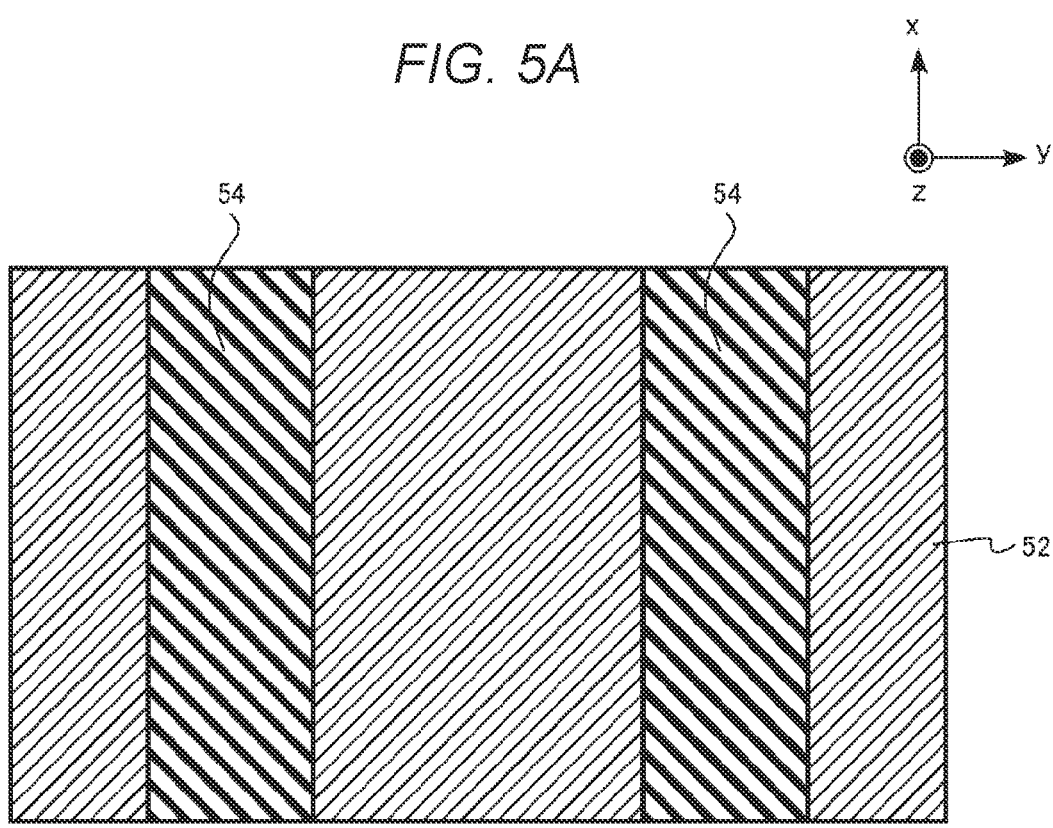
Figure 5B:
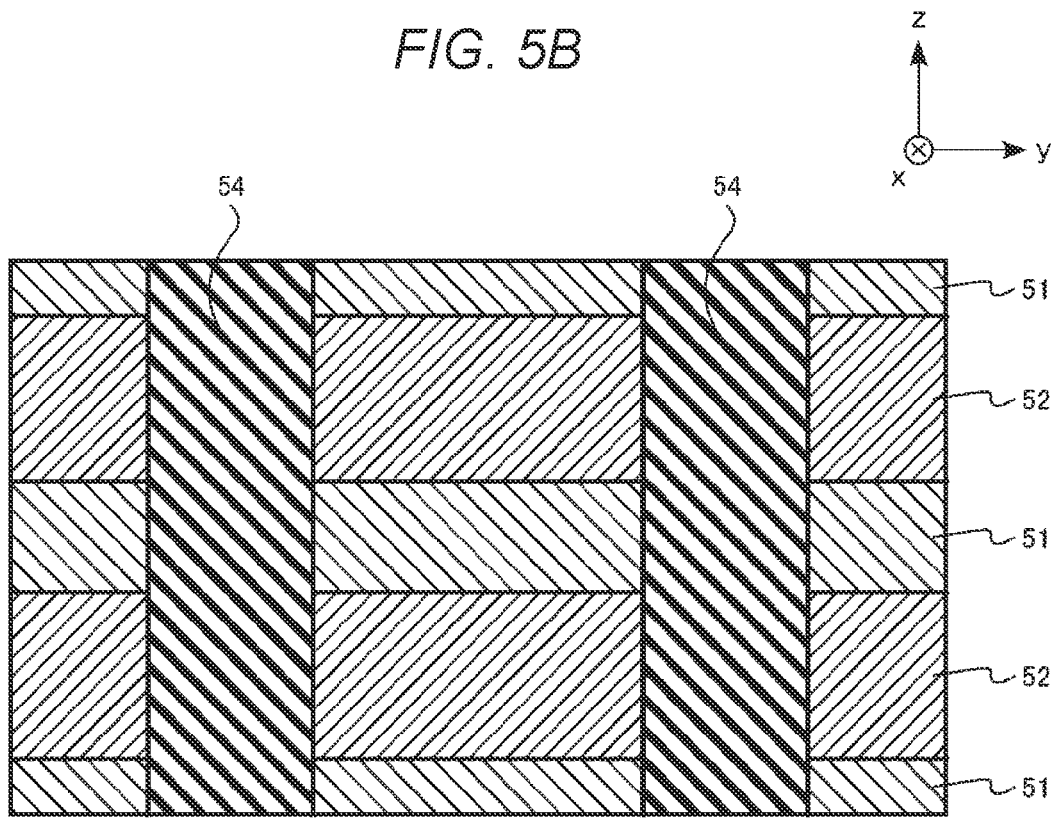

Next, a center of the first aperture portion 53 is filled with a carbon film 54 (FIGS. 5A and 5B). The carbon film 54 is formed using, for example, the CVD method.

Figure 6A:
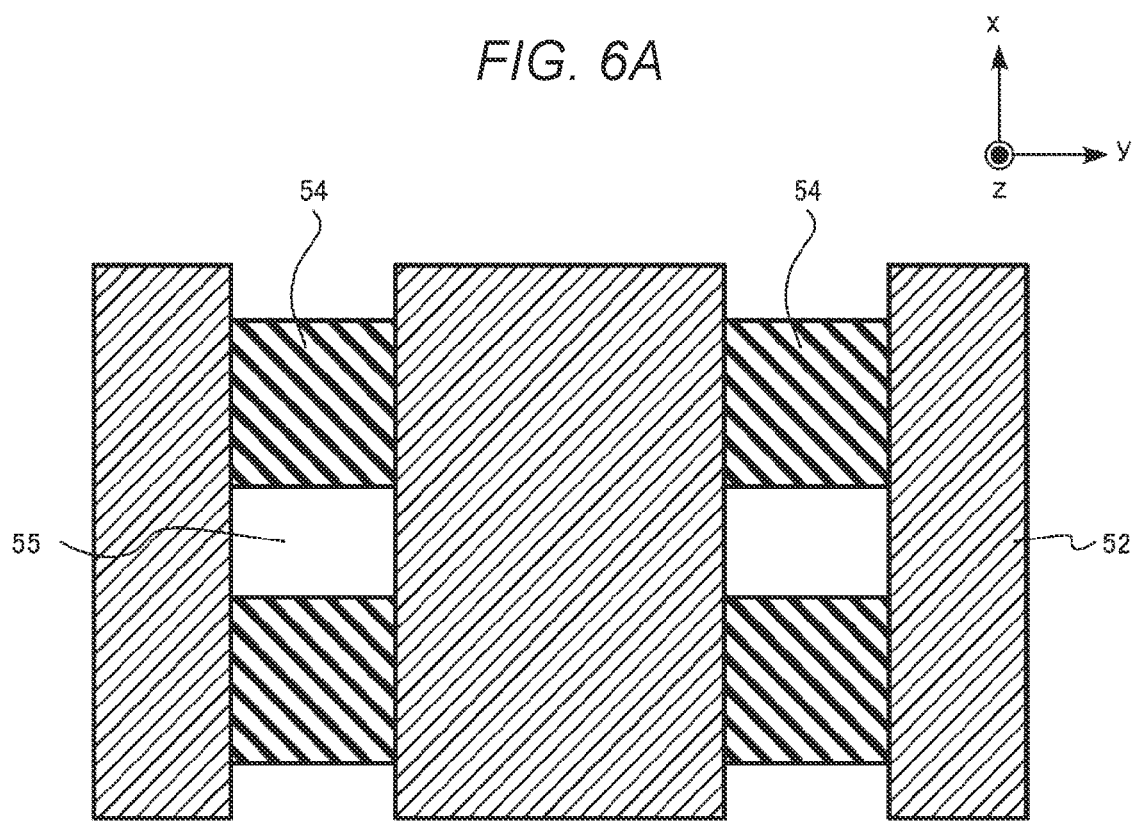
Figure 6B:
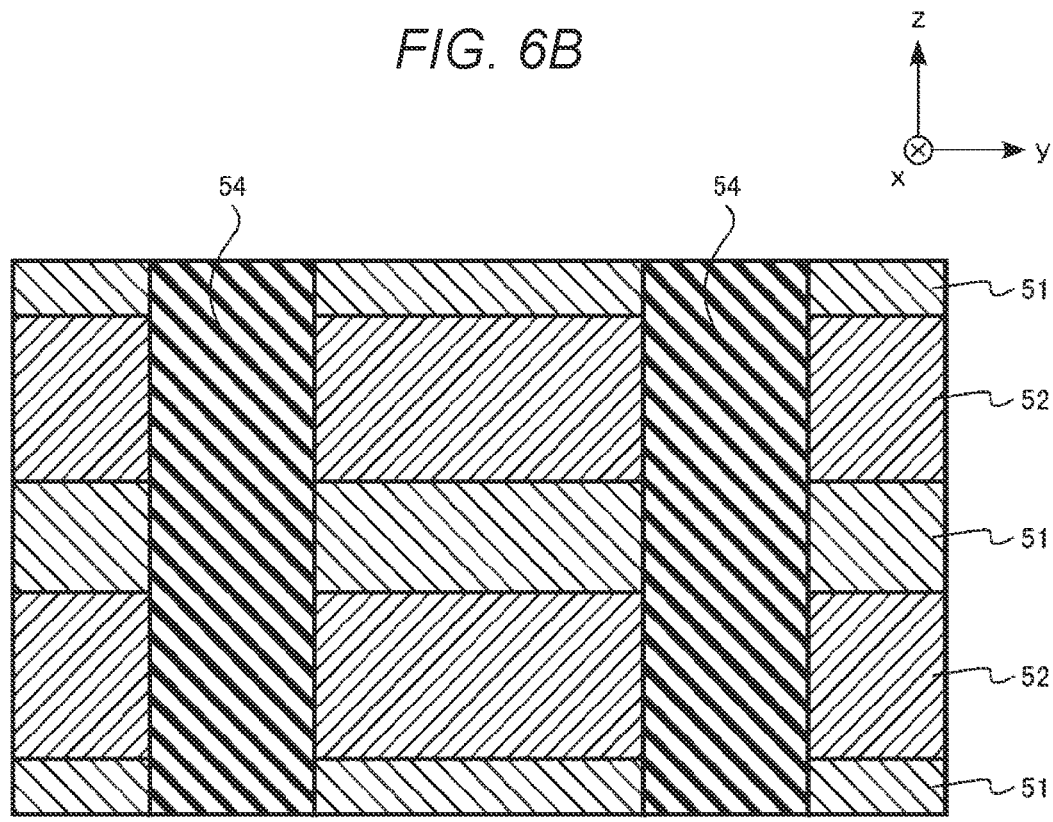

Next, a second aperture portion 55 is formed in the carbon film 54 (FIGS. 6A and 6B). The second aperture portion 55 is formed using, for example, lithography and the RIE method. The second aperture portion 55 extends in the z direction.

Figure 7A:
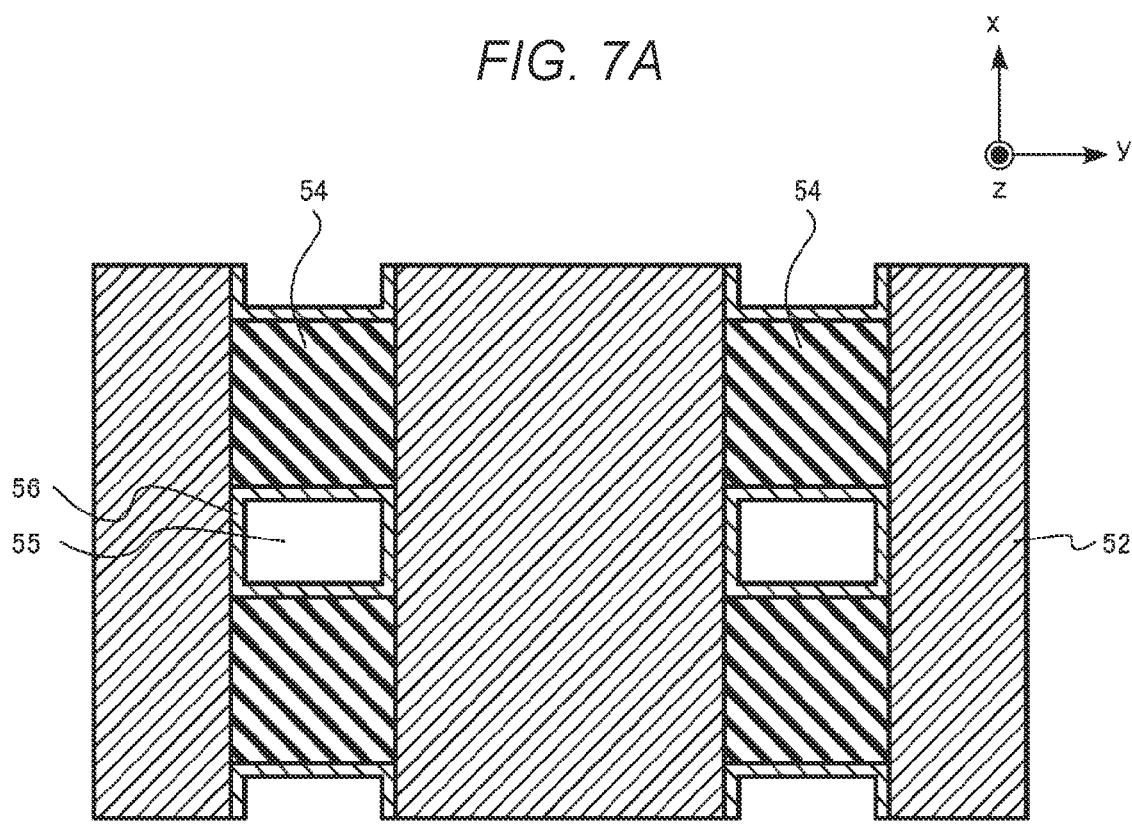
Figure 7B:
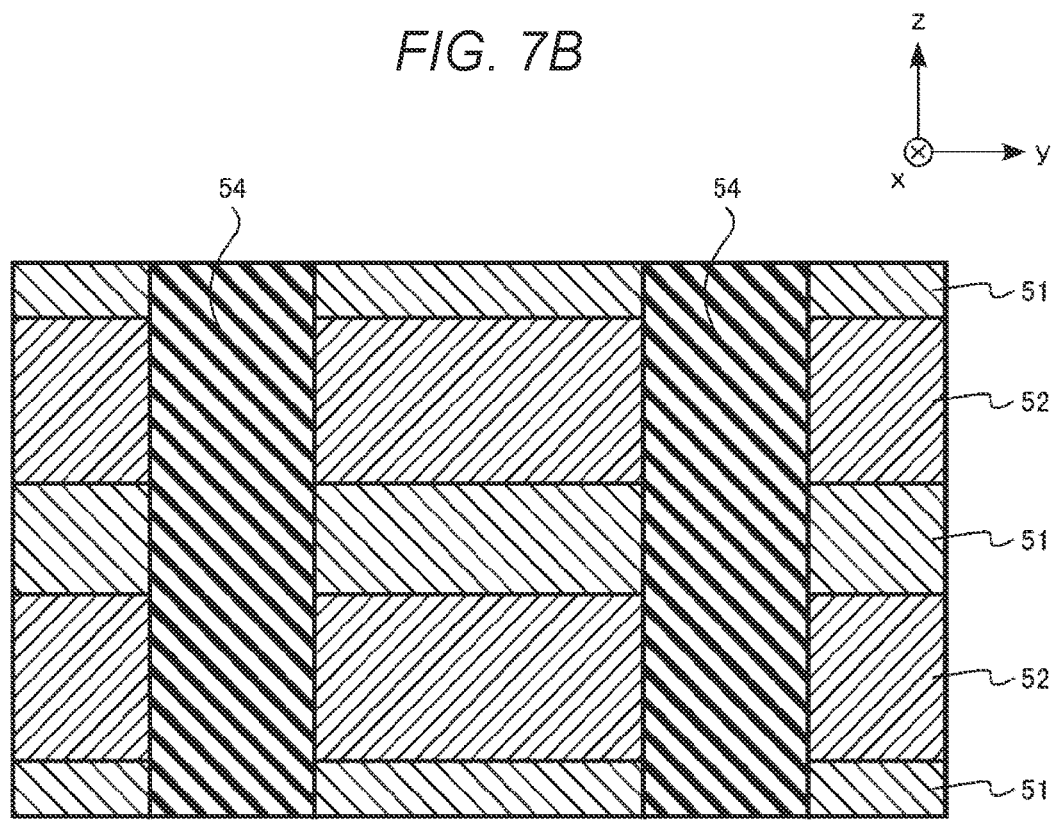

Next, a silicon nitride film 56 is formed on an inner wall of the second aperture portion 55 (FIGS. 7A and 7B). The silicon nitride film 56 is formed using, for example, the CVD method.

Figure 8A:
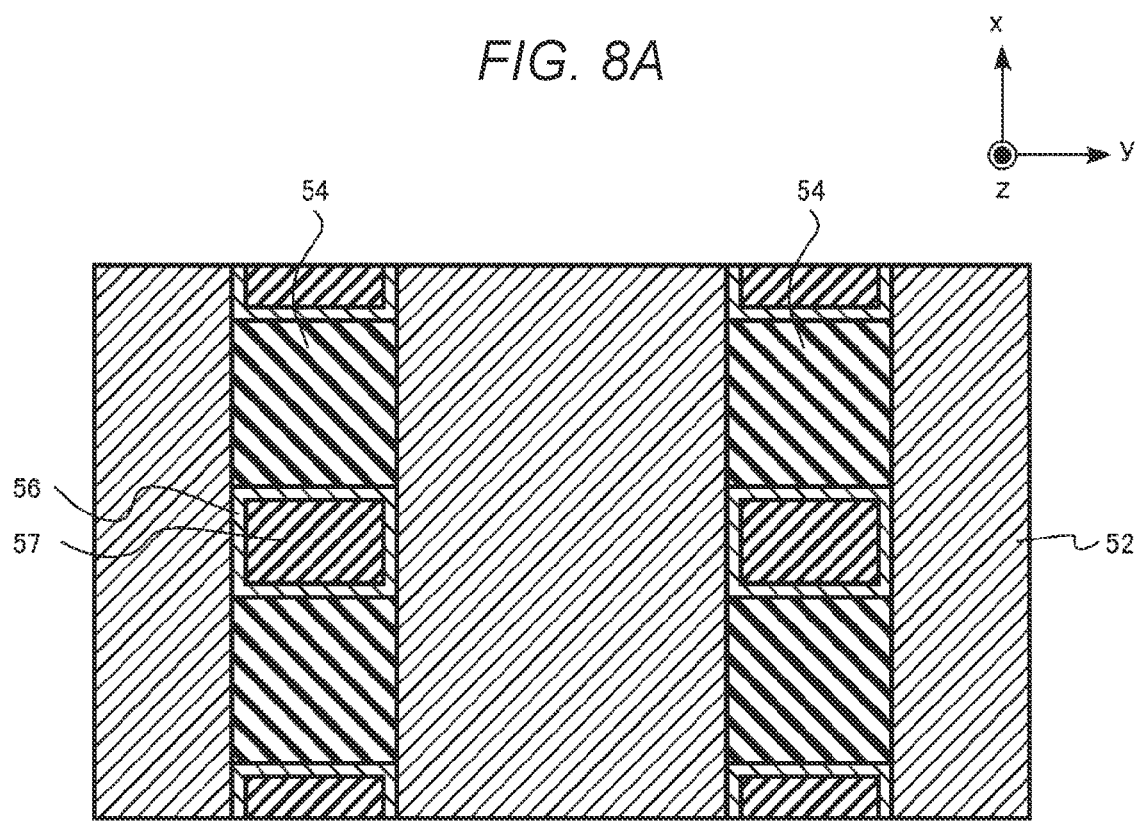
Figure 8B:
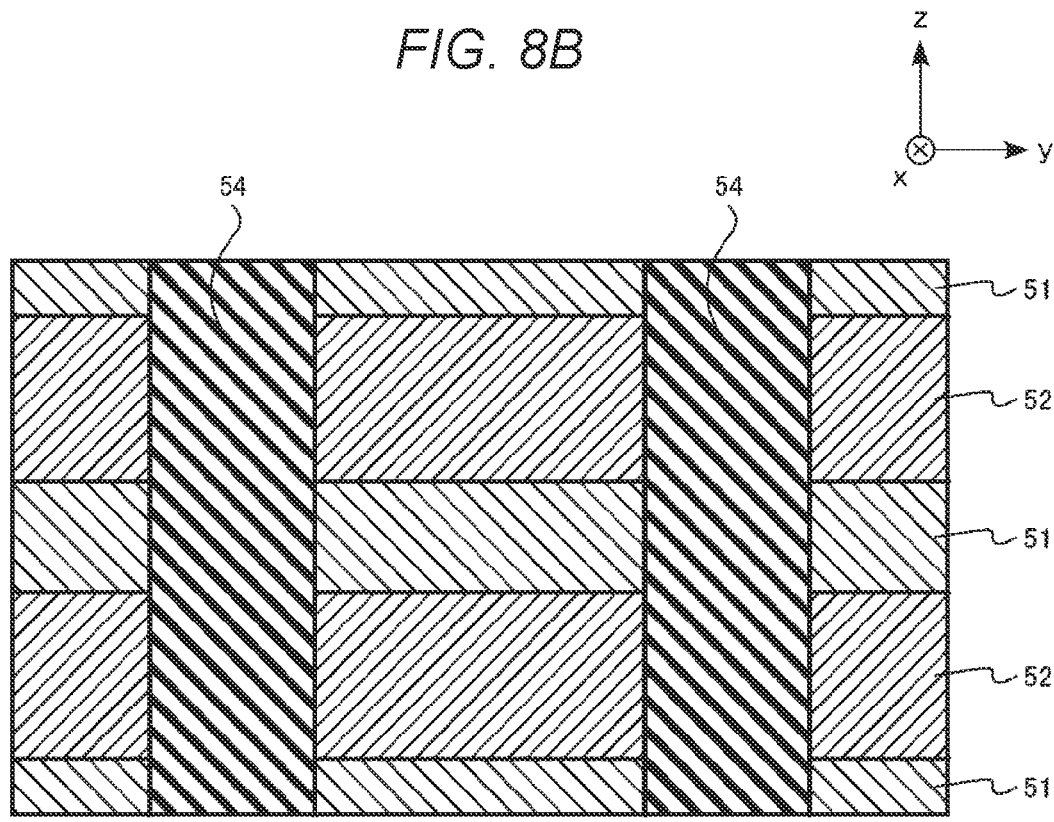

Next, the second aperture portion 55 is filled with a silicon oxide film 57 (FIGS. 8A and 8B). The silicon oxide film 57 is formed using, for example, the CVD method.

Figure 9A:
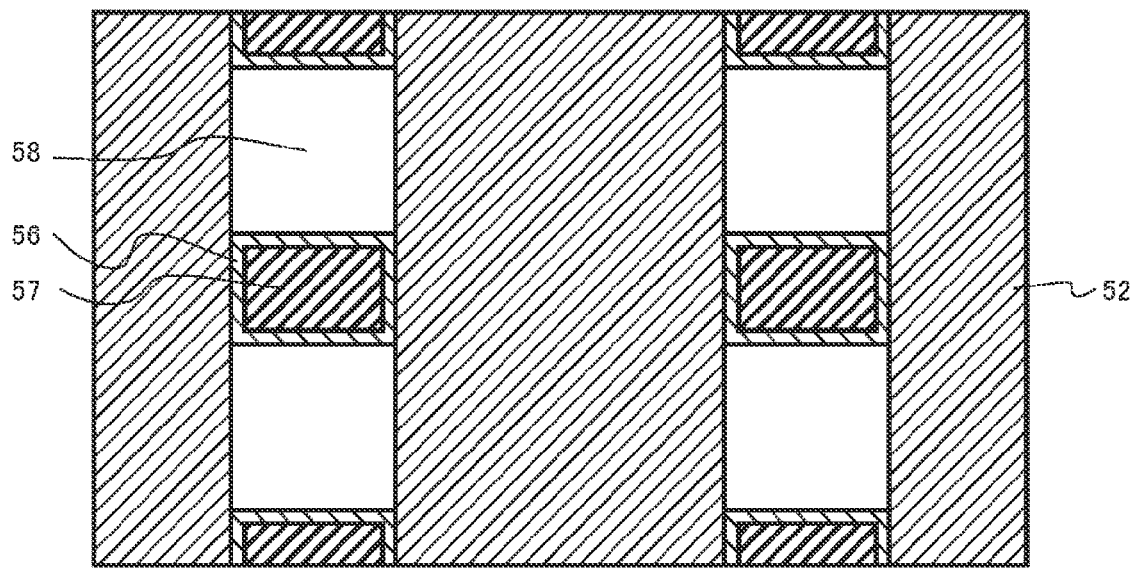
Figure 9B:
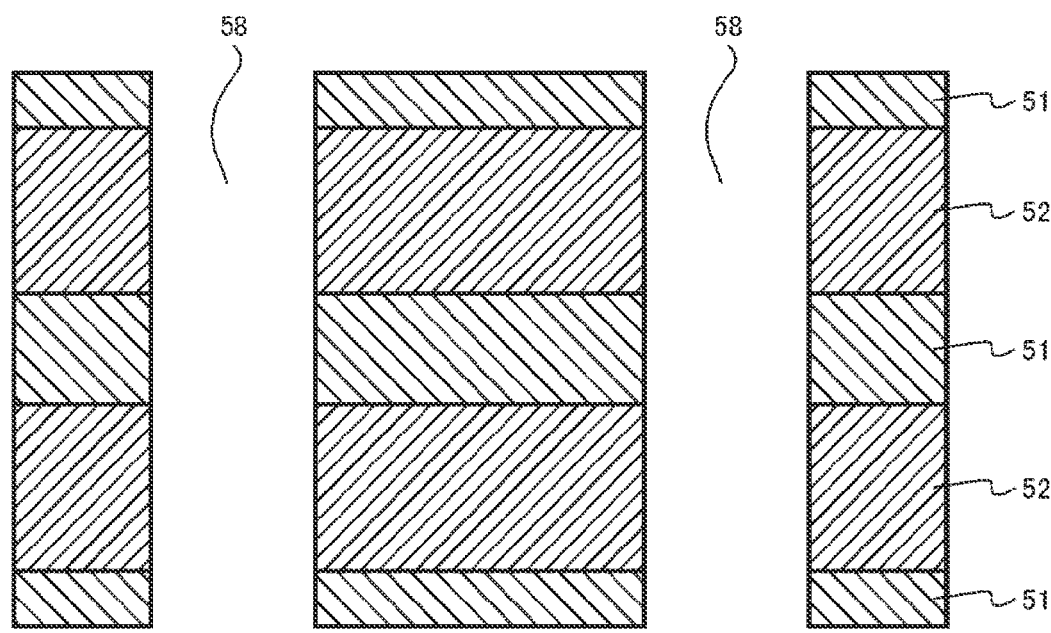

Next, the carbon film 54 is removed (FIGS. 9A and 9B). The carbon film 54 is removed using, for example, an asking method. Owing to the carbon film 54 being removed, a third aperture portion 58 is formed. The third aperture portion 58 extends in the z direction.

Figure 10A:
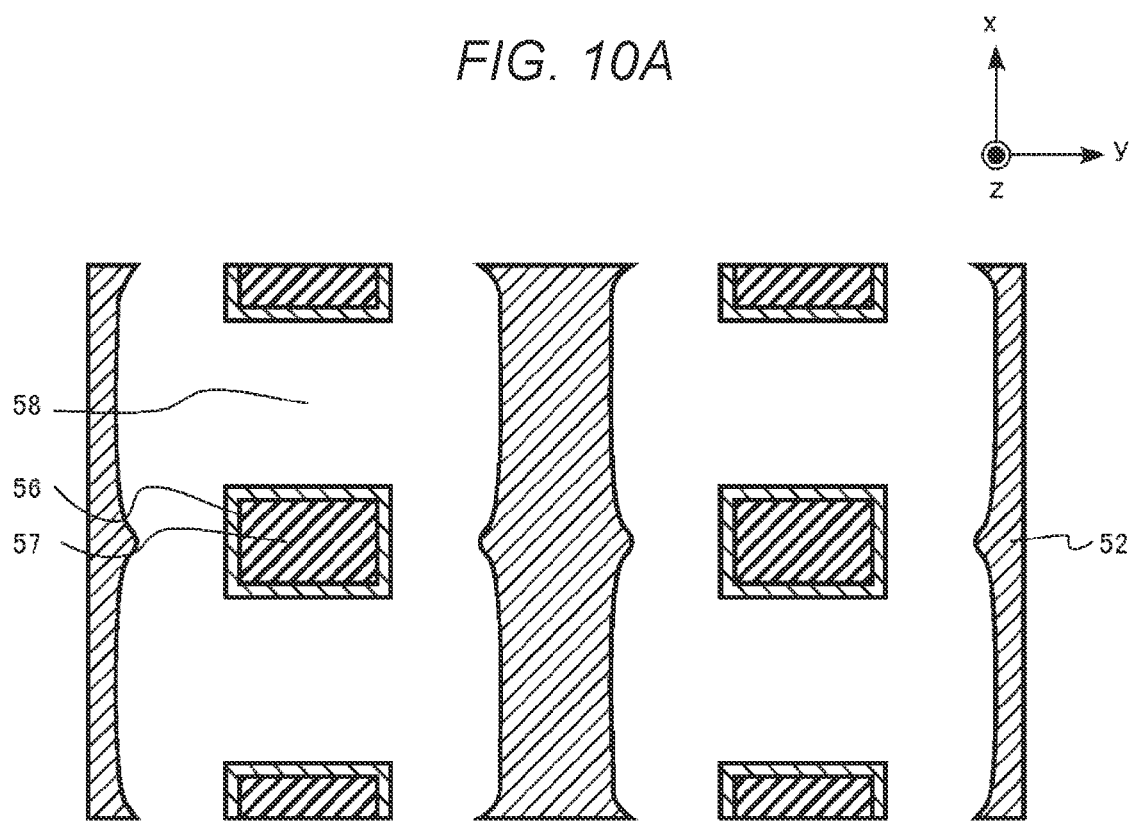
Figure 10B:
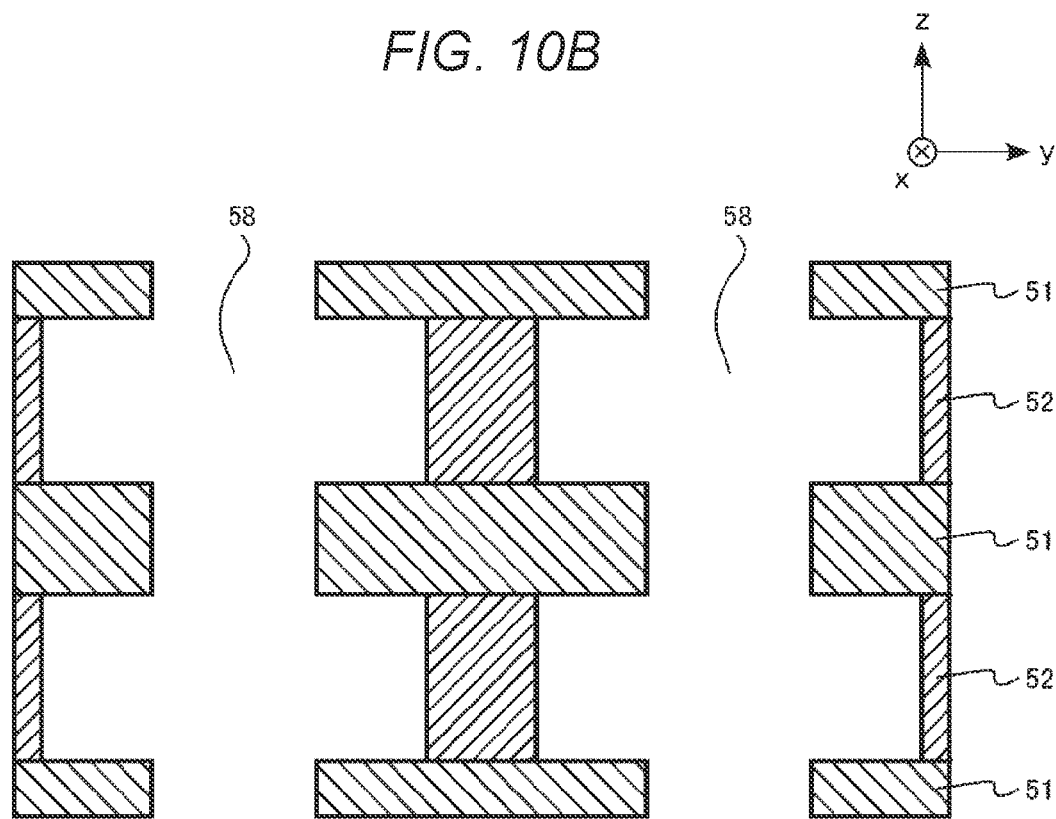

Next, the silicon oxide layer 52 is etched in a lateral direction (FIGS. 10A and 10B). The silicon oxide layer 52 is etched using, for example, a wet etching method.

Figure 11A:
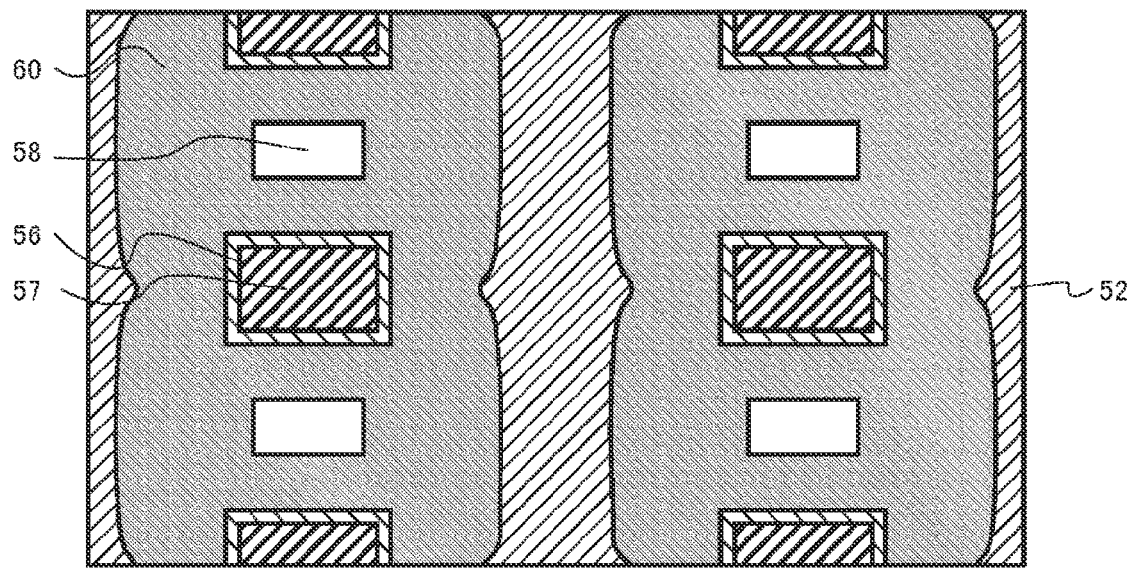
Figure 11B:
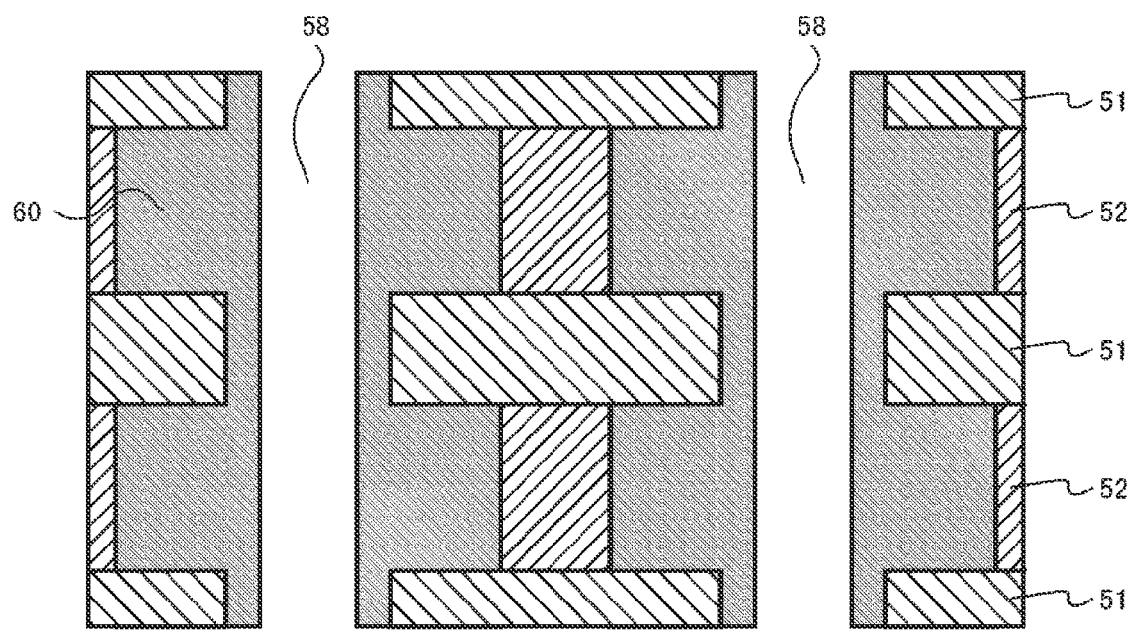

Next, a first amorphous silicon film 60 is formed on an inner wall of the third aperture portion 58 (FIGS. 11A and 11B). The first amorphous silicon film 60 is formed using, for example, the CVD method. One portion of the first amorphous silicon film 60 eventually becomes the semiconductor layer 14.

Figure 12A:
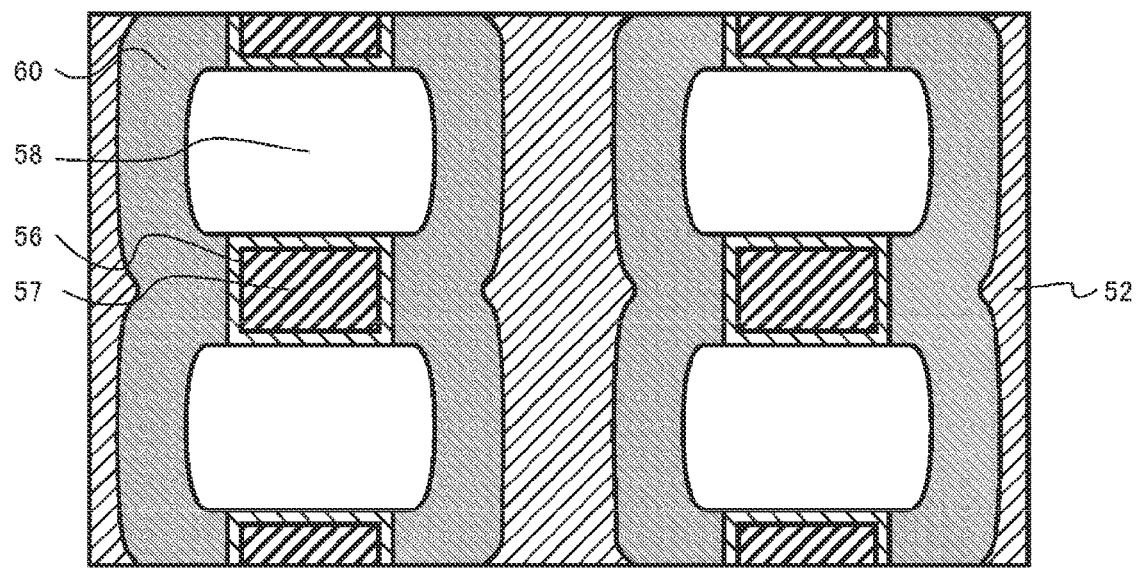
Figure 12B:
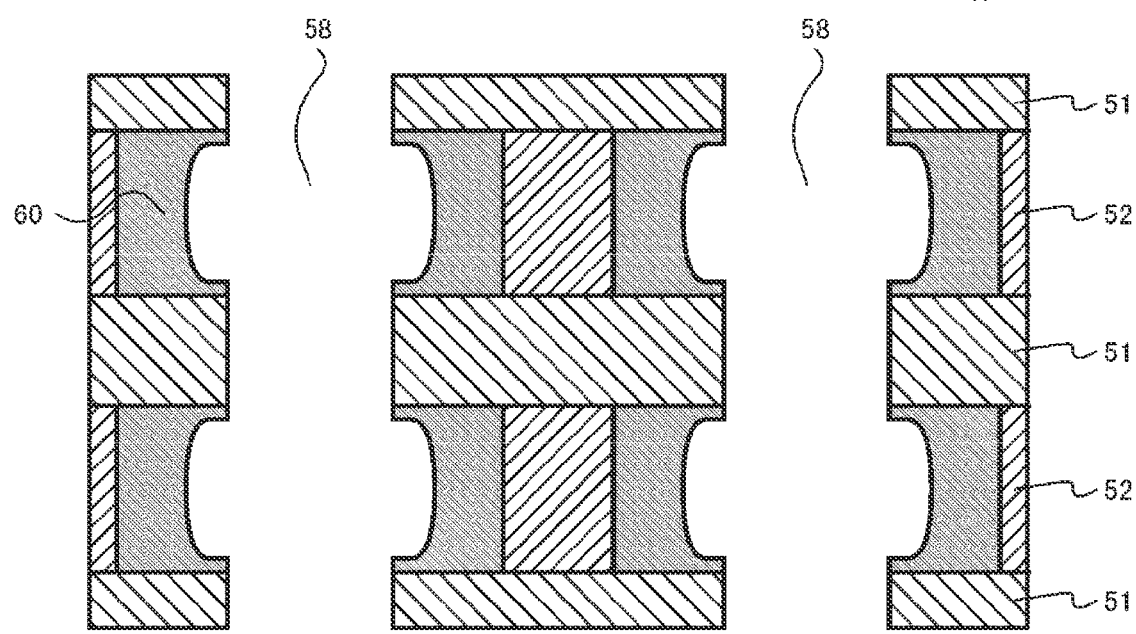

Next, the first amorphous silicon film 60 is etched in a lateral direction (FIGS. 12A and 12B). The first amorphous silicon film 60 is etched using, for example, an isotropic dry etching method.

Figure 13A:
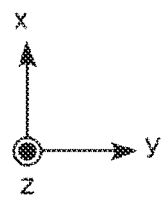
Figure 13A:
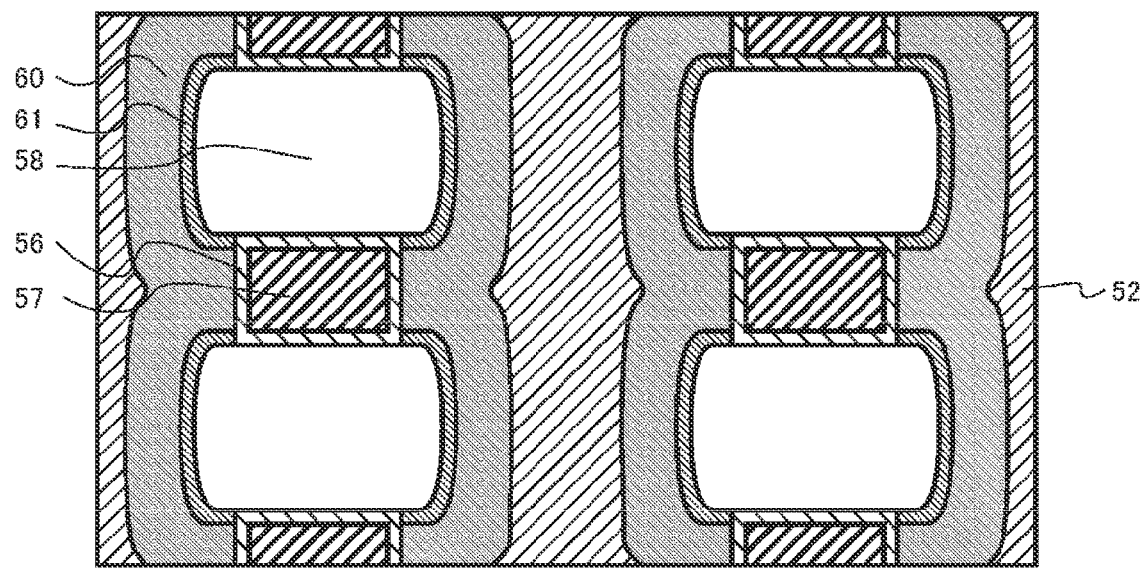
Figure 13B:
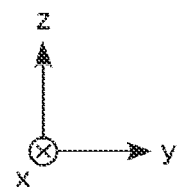
Figure 13B:
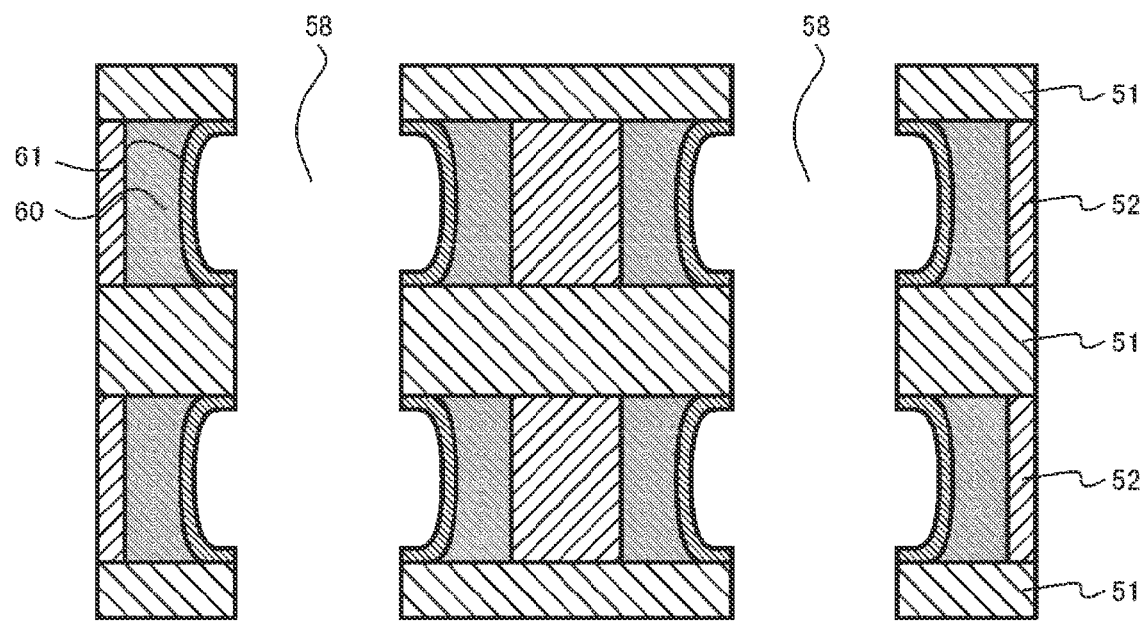

Next, a surface of the first amorphous silicon film 60 is thermally oxidized, forming a first thermal oxide film 61 (FIGS. 13A and 13B). The first thermal oxide film 61 eventually becomes the tunnel insulating film 18.

Figure 14A:
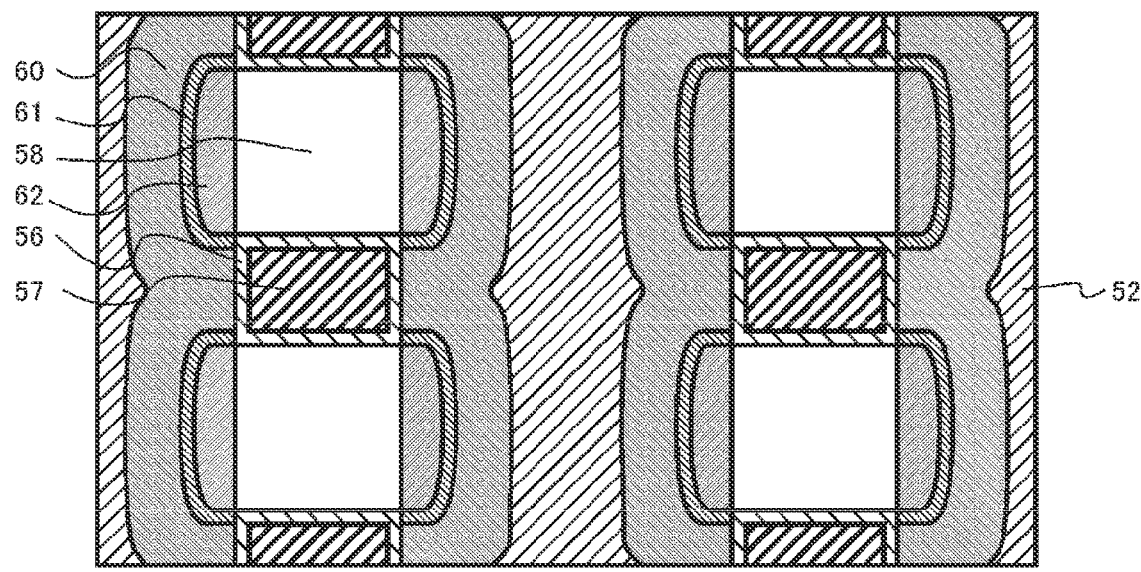
Figure 14B:
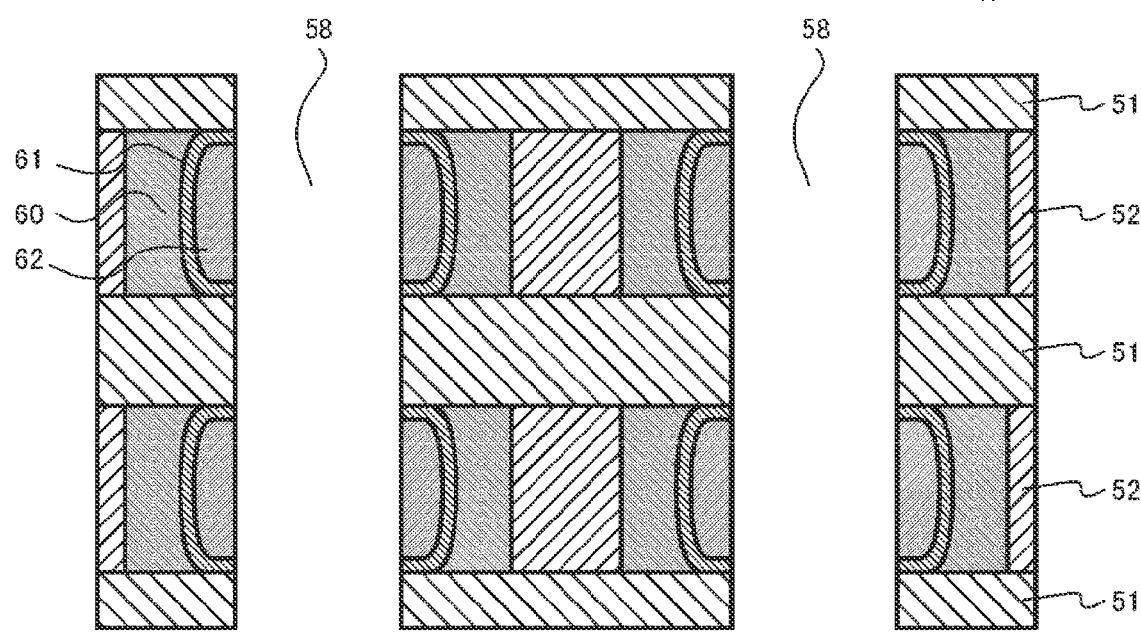

Next, a second amorphous silicon film 62 is formed on the first thermal oxide film 61 of the third aperture portion 58 (FIGS. 14A and 14B). The second amorphous silicon film 62 is formed using, for example, the CVD method and an isotropic etching. The second amorphous silicon film 62 eventually becomes the charge trapping layer 20.

Figure 15A:
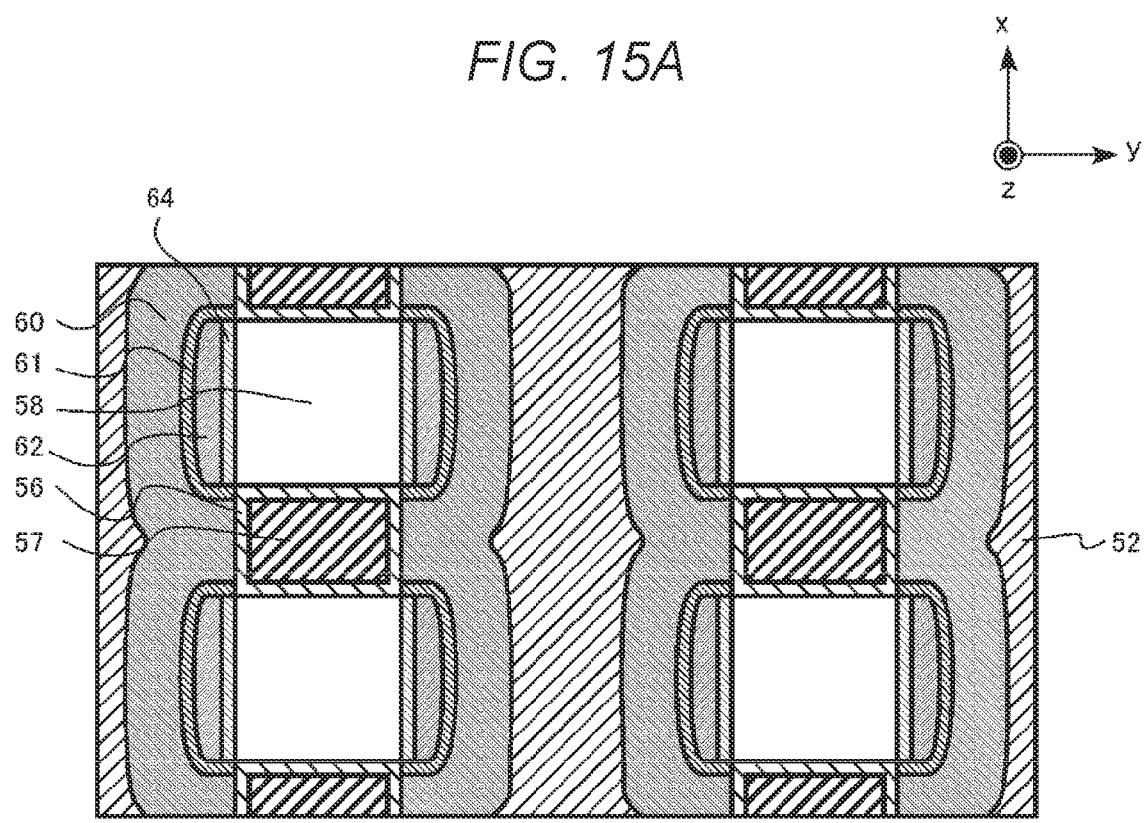
Figure 15B:
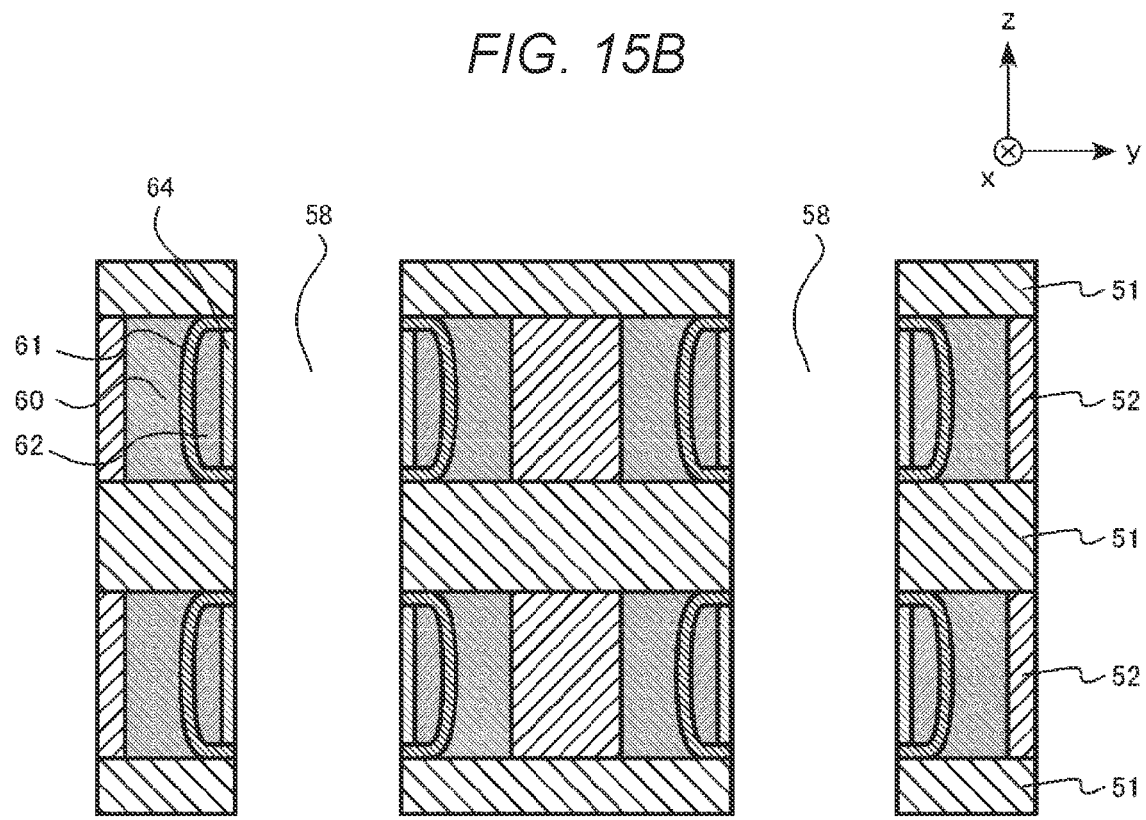

Next, a surface of the second amorphous silicon film 62 is thermally oxidized, forming a second thermal oxide film 64 (FIGS. 15A and 15B). The second thermal oxide film 64 eventually becomes the first block insulating film 22.

Figure 16A:
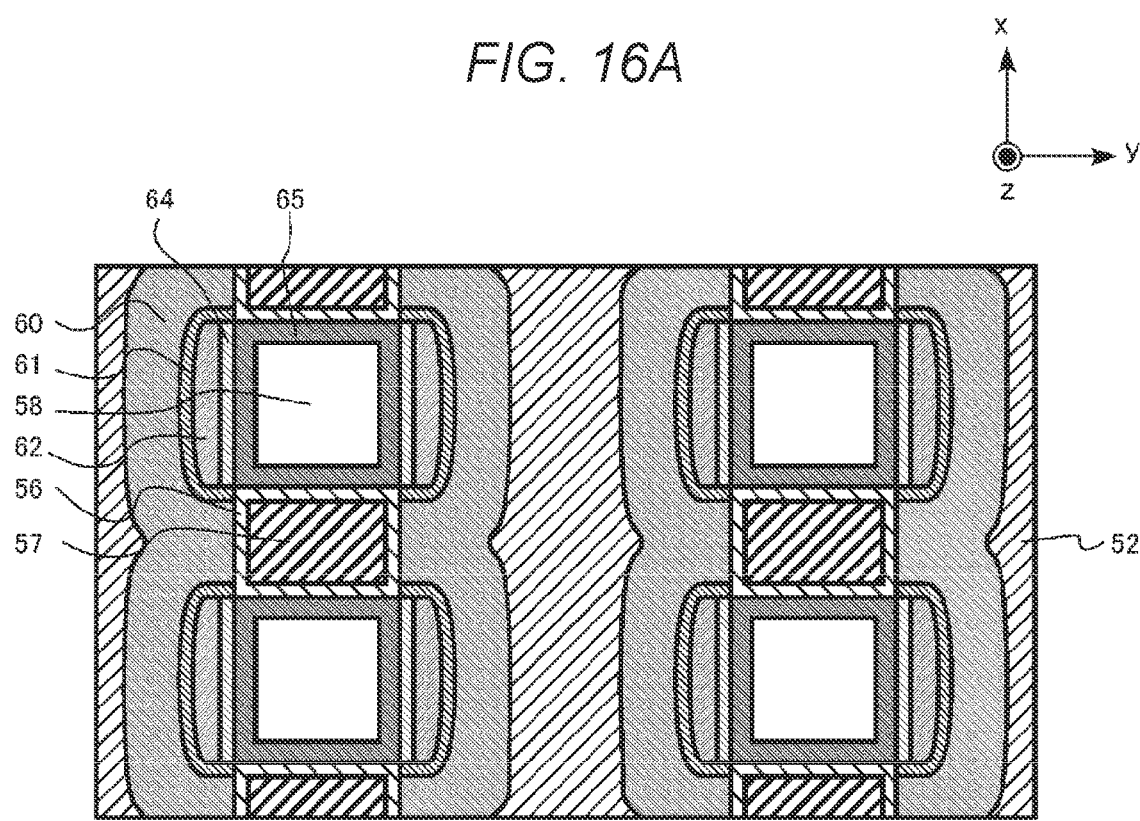
Figure 16B:
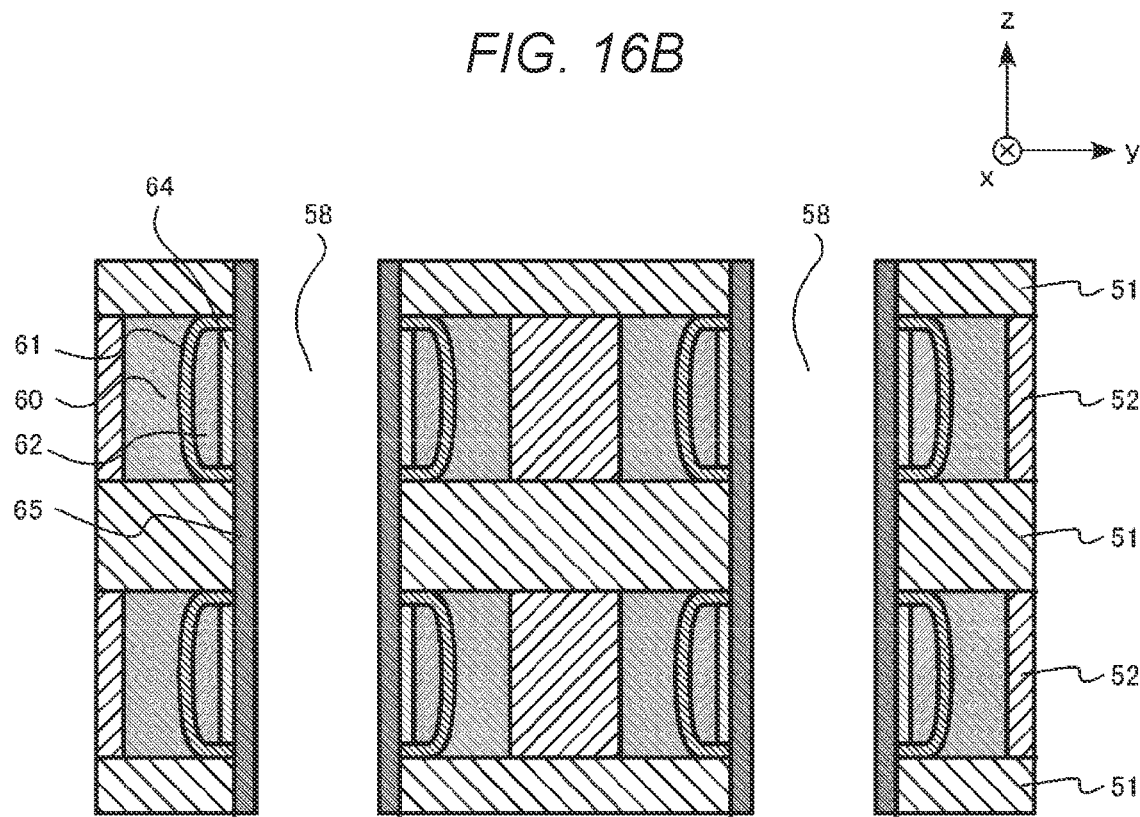

Next, an aluminum oxide film 65 is formed on the inner wall of the third aperture portion 58 (FIGS. 16A and 16B). The aluminum oxide film 65 is formed using, for example, the CVD method. One portion of the aluminum oxide film 65 eventually becomes the second block insulating film 24.

Figure 17A:
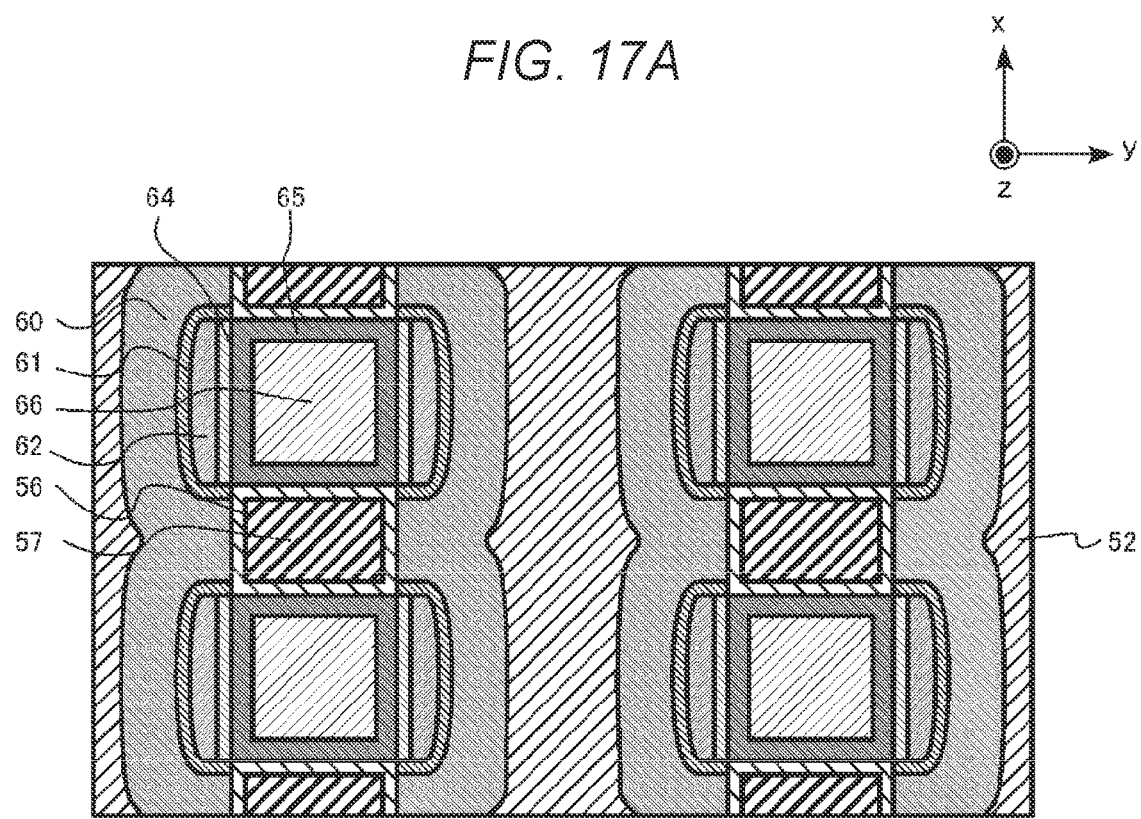
Figure 17B:
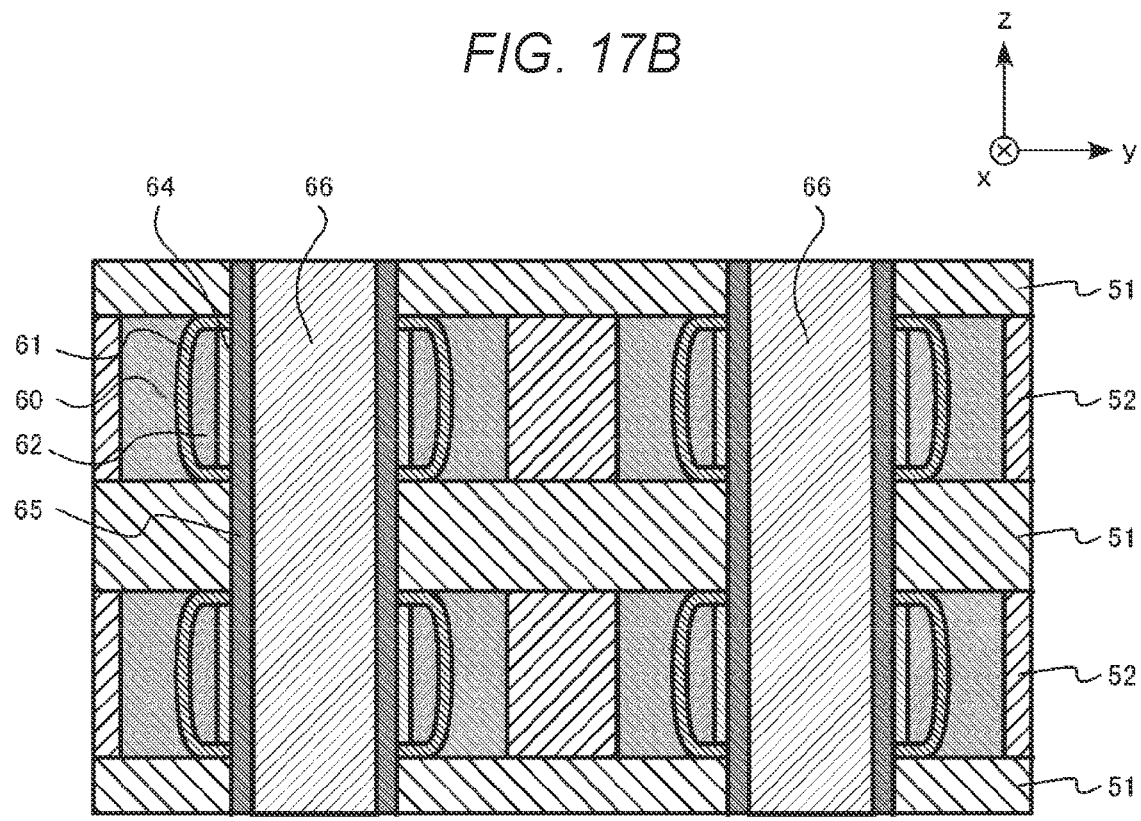

Next, the third aperture portion 58 is filled with a tungsten film 66 (FIGS. 17A and 17B). The tungsten film 66 is formed using, for example, the CVD method. One portion of the tungsten film 66 eventually becomes the gate electrode layer 16.

Figure 18A:
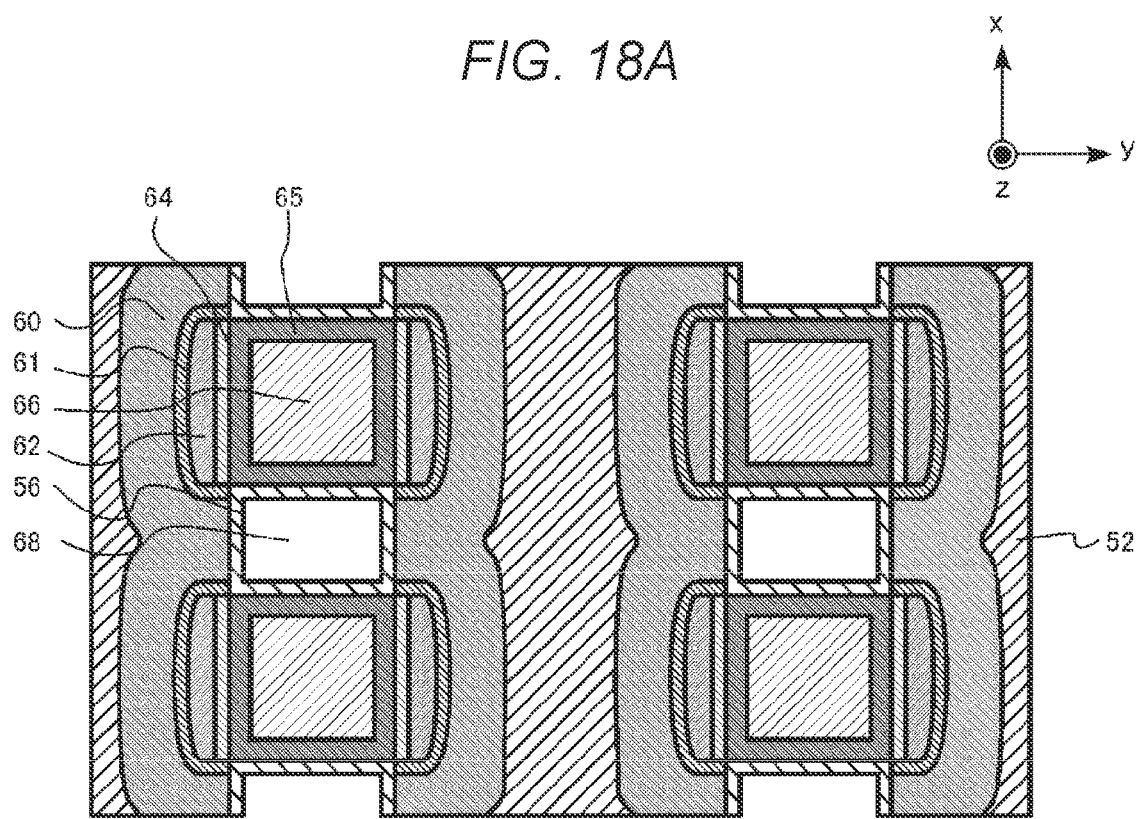
Figure 18B:
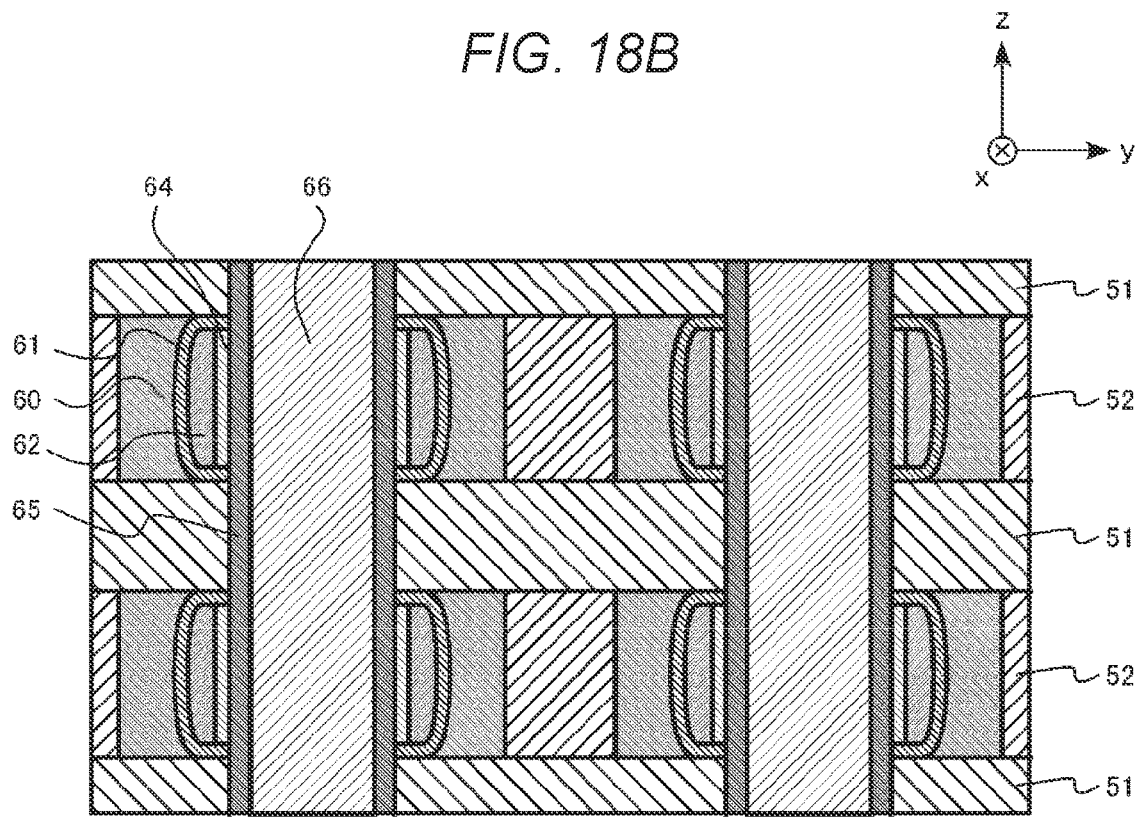

Next, the silicon oxide film 57 is removed (FIGS. 18A and 18B). The silicon oxide film 57 is removed using, for example, a wet etching method. Owing to the silicon oxide film 57 being removed, a fourth aperture portion 68 is formed. The fourth aperture portion 68 extends in the z direction.

Figure 19A:
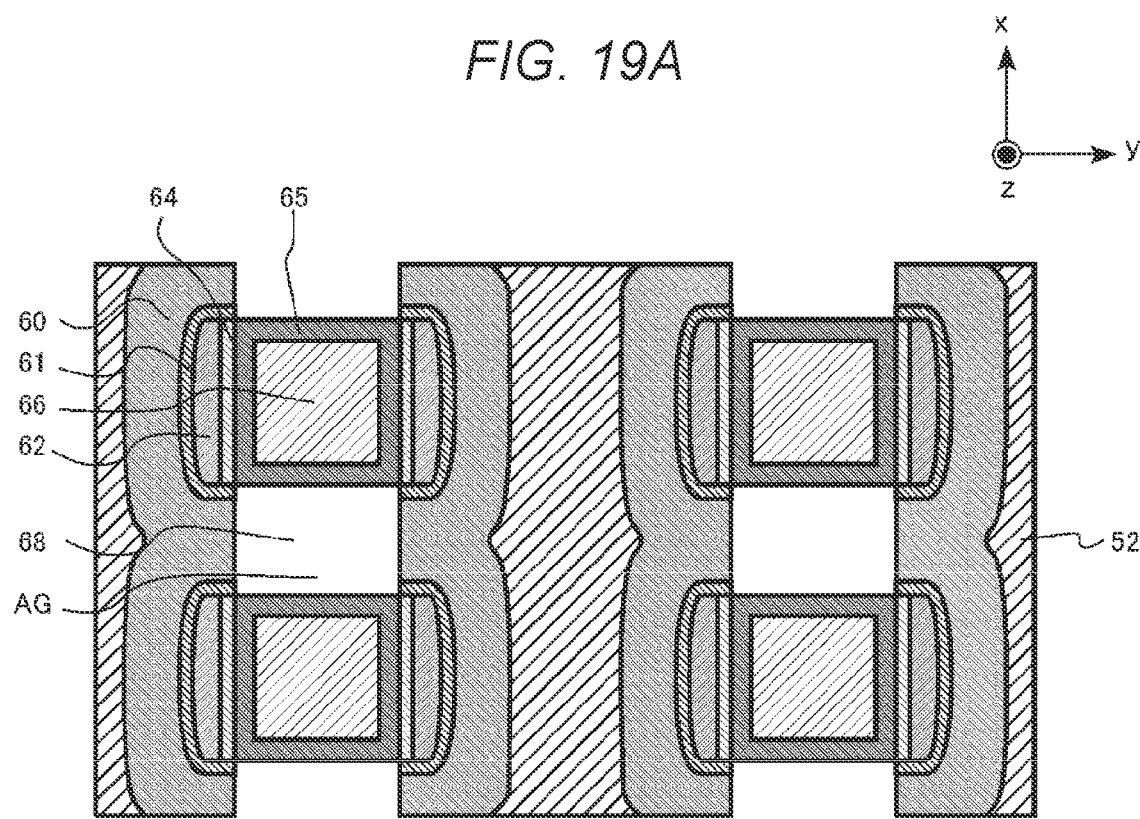
Figure 19B:
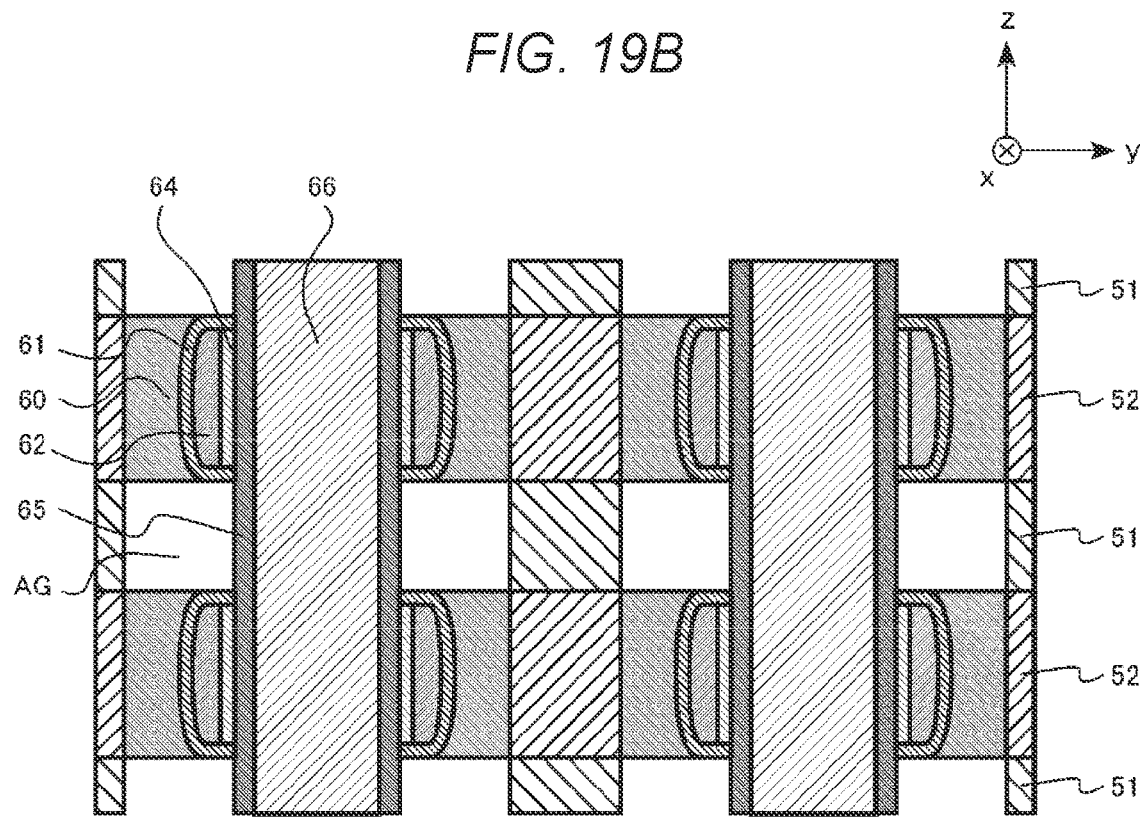

Next, one portion of the silicon nitride film 56 and of the silicon nitride layer 51 is removed (FIGS. 19A and 19B). One portion of the silicon nitride film 56 and of the silicon nitride layer 51 is removed using, for example, a wet etching method. Owing to one portion of the silicon nitride layer 51 being removed, the gap AG is formed.

According to the heretofore described manufacturing method, the memory cell array of the flash memory 100 of the embodiment is manufactured.

Next, effects and advantages of the semiconductor storage device of the embodiment will be described.

A three-dimensional NAND flash memory in which memory cells are arranged three-dimensionally realizes a high degree of integration and low cost. The degree of integration can be increased still further by miniaturizing the memory cells of the three-dimensional NAND flash memory. When the memory cells are miniaturized, inter-cell interference between neighboring memory cells increases, and there is concern about an operation of the three-dimensional NAND flash memory becoming unstable.

Figure 20:
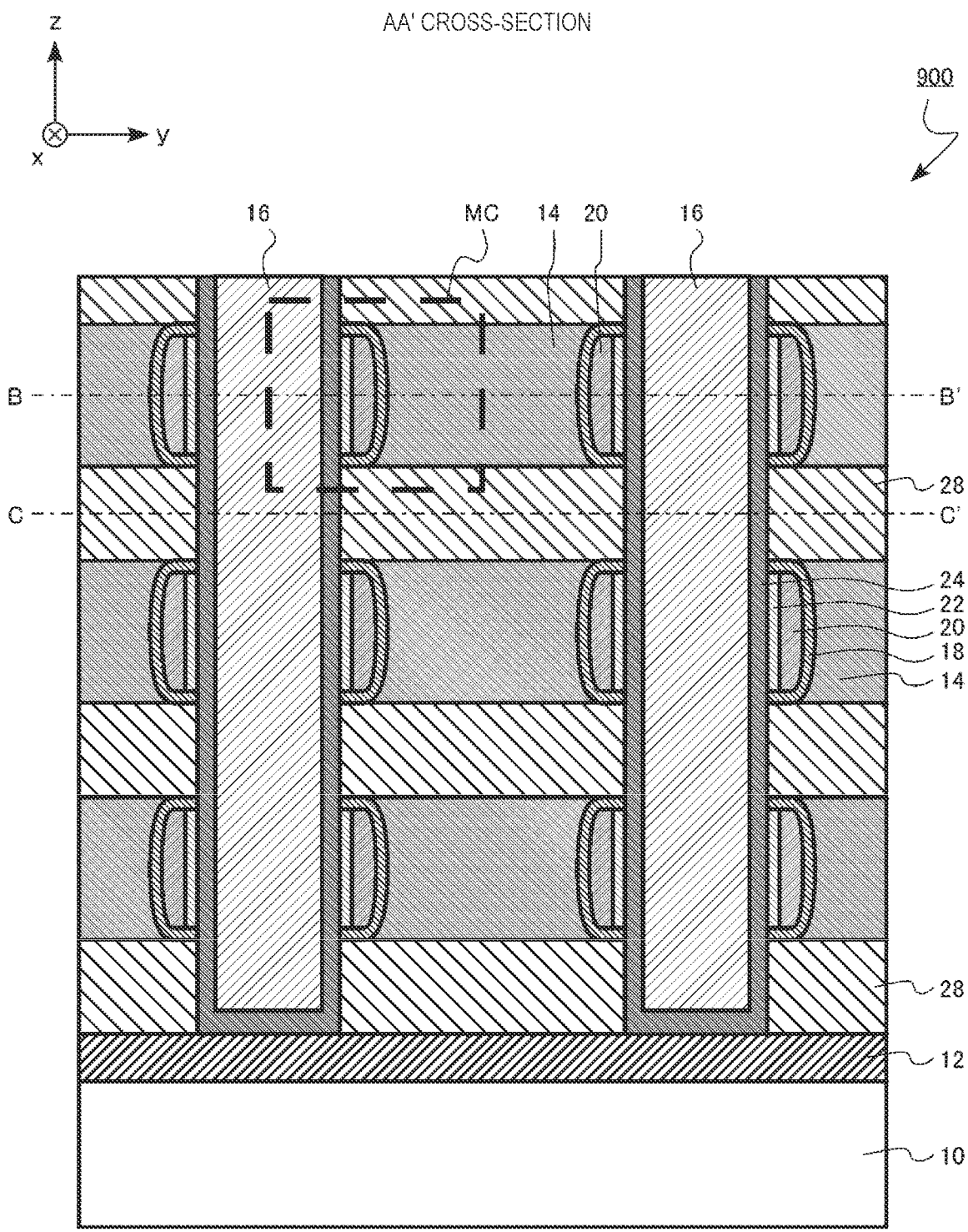
FIG. 20 is a schematic cross-sectional view of a semiconductor storage device of a comparative example.
Figure 21A:
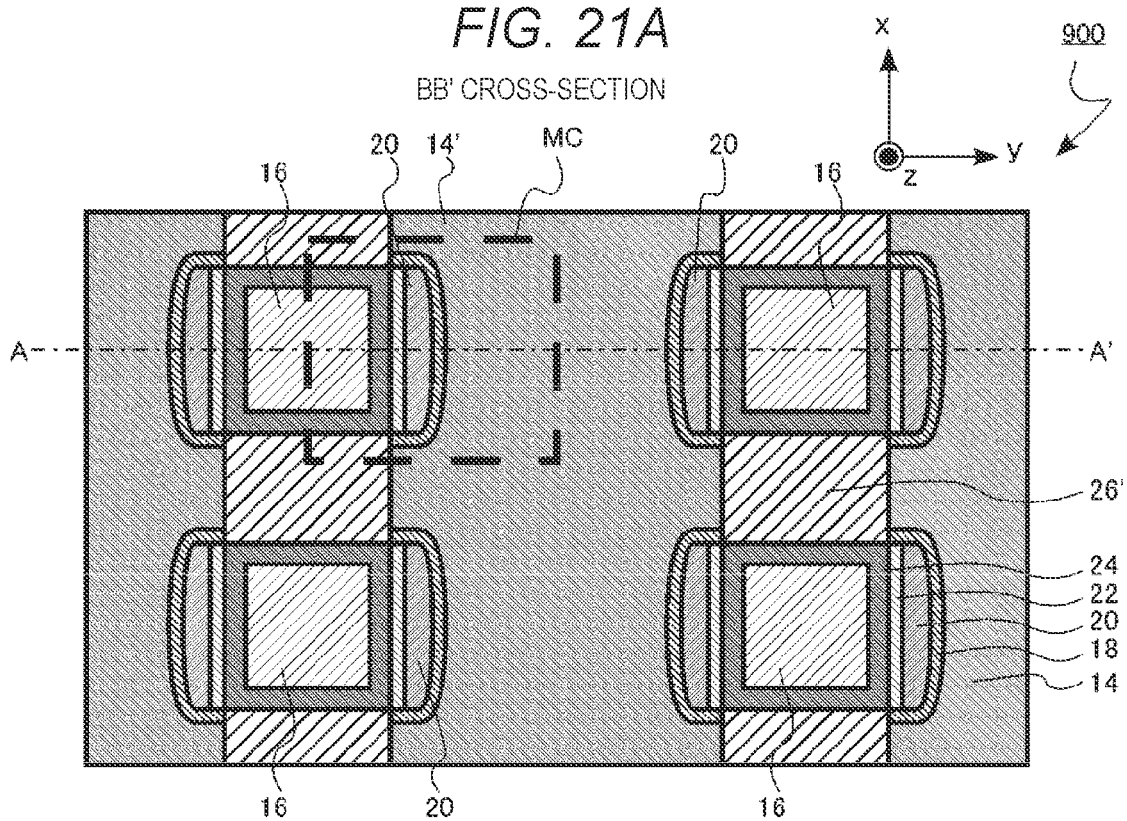
FIGS. 21A and 21B are additional schematic cross-sectional views of the semiconductor storage device of the comparative example.
Figure 21B:
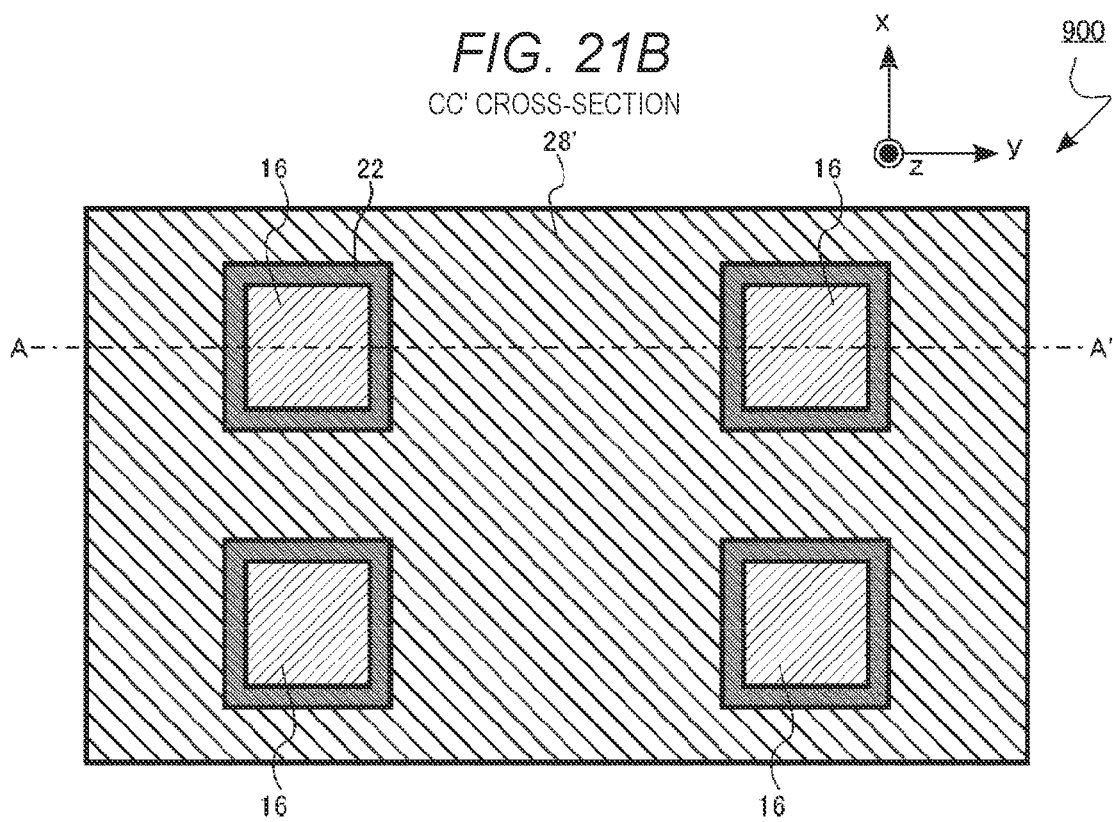

FIGS. 20, 21A, and 21B are schematic sectional views of a semiconductor storage device of a comparative example. FIGS. 20, 21A, and 21B are sectional views of a memory cell array of a flash memory 900 of the comparative example.

FIG. 20 is an AA' cross-section of FIGS. 21A and 21B. FIG. 21A is a BB' cross-section of FIG. 20. FIG. 21B is a CC' cross-section of FIG. 20. A region enclosed by broken lines in FIGS. 20 and 21A is one memory cell MC. FIGS. 20, 21A, and 21B are drawings corresponding to FIGS. 1, 2A, and 2B respectively of the embodiment.

The flash memory 900 of the comparative example differs from the flash memory 100 of an embodiment in that a semiconductor layer 14' between pairs of gate electrode layers 16 neighboring in the y direction is not separated (divided into discrete portions). Also, the flash memory 900 of the comparative example differs from the flash memory 100 in that a second interlayer insulating layer 28' is provided between semiconductor layers 14' neighboring in the z direction. Also, the flash memory 900 of the comparative example differs from the flash memory 100 in that the second interlayer insulating layer 28' is provided between charge trapping layers 20 neighboring in the z direction. Also, the flash memory 900 of the comparative example differs from the flash memory 100 in that a first interlayer insulating layer 26' is provided between gate electrode layers 16 neighboring in the x direction.

The flash memory 900 of the comparative example is such that the semiconductor layer 14' between gate electrode layers 16 neighboring in the y direction is not separated (divided). Consequently, when the memory cell MC is miniaturized and the distance between the adjacent gate electrode layers 16 becomes shorter, interference between the memory cells MC neighboring each other in the y direction increases. Therefore, there is concern about an operation of the flash memory 900 becoming unstable.

The flash memory 100 of the embodiment is such that the semiconductor layer 14 is separated (divided) by the first interlayer insulating layer 26 between pairs of gate electrode layers 16 neighboring in the y direction. Specifically, for example, a first interlayer insulating layer 26 is provided between the first semiconductor layer 14*a* and the second semiconductor layer 14*b*, and the first semiconductor layer 14*a* and the second semiconductor layer 14*b* are thus separated from one another in the y direction. This means that even when the memory cell MC is miniaturized and the distance between the gate electrode layers 16 becomes shorter, interference between memory cells MC neighboring in the y direction is reduced. Therefore, an operation of the flash memory 100 is more stable.

The flash memory 900 of the comparative example is such that the second interlayer insulating layer 28' is provided between two semiconductor layers 14' neighboring in the z direction. Consequently, when the memory cell MC is miniaturized and a distance between the semiconductor layers 14' neighboring in the z direction becomes shorter, interference between memory cells MC neighboring in the z direction increases. Therefore, there is concern about an operation of the flash memory 900 becoming unstable.

The flash memory 100 is such that two semiconductor layers 14 neighboring in the z direction are separated by the gap AG, without a second interlayer insulating layer 28 being provided between the semiconductor layers 14 neighboring each other in the z direction. Specifically, for example, the first semiconductor layer 14*a* and the third semiconductor layer 14*c* are separated by the gap AG. An electrical permittivity of the gap AG is extremely small with respect to that of the second interlayer insulating layer 28, which is a solid insulator material. This means that even when the memory cell MC is miniaturized and the distance between adjacent semiconductor layers 14 becomes shorter, interference between two memory cells MC neighboring in the z direction is reduced. Therefore, an operation of the flash memory 100 is stable.

The flash memory 900 of the comparative example is such that the second interlayer insulating layer 28' is provided between charge trapping layers 20 neighboring in the z direction. Consequently, when the memory cells MC are miniaturized and a distance between the charge trapping layers 20 neighboring in the z direction becomes shorter, interference between memory cells MC neighboring in the z direction increases. Therefore, there is concern about an operation of the flash memory 900 becoming unstable.

The flash memory 100 is such that charge trapping layers 20 neighboring in the z direction are separated by the gap AG, without any second interlayer insulating layer 28 being provided there between in the z direction. Specifically, for example, the first charge trapping layer 20a and the third charge trapping layer 20c are separated by the gap AG. A permittivity of the gap AG is extremely small compared to that of the second interlayer insulating layer 28, which is a solid insulator material. This means that even when the memory cells MC are miniaturized and the distance between the charge trapping layers 20 becomes shorter, interference between memory cells MC neighboring in the z direction is reduced. Therefore, an operation of the flash memory 100 is stable.

The flash memory 900 of the comparative example is such that the first interlayer insulating layer 26' is provided between gate electrode layers 16 neighboring in the x direction. Consequently, when the memory cell MC is miniaturized and a distance between the gate electrode layers 16 neighboring in the x direction becomes shorter, a capacitance between the two gate electrode layers 16 increases. When the capacitance between the gate electrode layers 16 increases, for example, an operation of the flash memory 900 is delayed. Also, for example, power consumption of the flash memory 900 increases.

The flash memory 100 is such that gate electrode layers 16 neighboring in the x direction are separated by the gap AG. Specifically, for example, the first gate electrode layer 16a and the third gate electrode layer 16c are separated by the gap AG. This means that even when the memory cells MC are miniaturized and the distance between gate electrode layers 16 neighboring in the x direction becomes shorter, an increase in capacitance between the gate electrode layers 16 is restricted. Therefore, an operation of the flash memory 100 being delayed and power consumption of the flash memory 100 increasing are restricted.

Furthermore, the flash memory 100 of the embodiment is such that gate electrode layers 16 neighboring in the y direction are also separated by the gap AG. For this reason, an increase in capacitance between the gate electrode layers 16 is also reduced, and an operation of the flash memory 100 being delayed and power consumption of the flash memory 100 increasing are restricted.

The flash memory 100 is such that semiconductor layers 14 neighboring in the z direction are separated by the gap AG. Because of this, there is concern about a decrease in mechanical strength of the memory cell array. The flash memory 100 of the embodiment is such that the second interlayer insulating layer 28 mechanically supports the first interlayer insulating layers 26 neighboring in the z direction. Consequently, a decrease in mechanical strength of the memory cell array caused by the presence of gap AG is reduced/mitigated.

The width of the first portion 28a of the second interlayer insulating layer 28 in the y direction from the first gate electrode layer 16a toward the second gate electrode layer 16b (d1 in FIGS. 1 and 2B) is preferably greater than the width in the y direction of the third portion 28c (d2 in FIG. 2B). When the width of one portion of the second interlayer insulating layer 28 is increased, the mechanical strength of the memory cell array increases.

In terms of increasing the mechanical strength of the memory cell array, the width d1 in the y direction of the first portion 28a is preferably 1.2 times or more than the width d2 in the y direction of the third portion 28c, and more preferably 1.5 times or more.

The width of the first portion 28a of the second interlayer insulating layer 28 in the y direction from the first gate electrode layer 16a toward the second gate electrode layer 16b (d1 in FIGS. 1 and 2B) is preferably smaller than the distance in the y direction between the first semiconductor layer 14a and the second semiconductor layer 14b (d3 in FIGS. 1 and 2A). According to the heretofore described configuration, a second interlayer insulating layer 28 being between pairs of semiconductor layers 14 neighboring in the z direction can be avoided. The width d1 in the y direction of the first portion 28a is preferably 0.8 times or less the distance d3 in the y direction between the first semiconductor layer 14a and the second semiconductor layer 14b.

According to an embodiment, a semiconductor storage device can be provided such that interference between neighboring memory cells MC is reduced, and operations of the device can be stable.

In an embodiment, a floating gate type of memory cell in which a charge trapping layer is a conductor was described as an example. In other examples, a charge trapping type of memory cell in which a charge trapping layer is an insulator may be adopted.

In an embodiment, a substrate as a semiconductor substrate is described as an example, but in other examples the substrate can be an insulating substrate. In some examples, a structure without a substrate can be adopted.

In an embodiment, twelve semiconductor layers and four gate electrode layers are described as an example, but the number of semiconductor layers and the number of gate electrode layers are not limited to these numbers.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a first gate electrode layer extending in a first direction;
   a second gate electrode layer extending in the first direction;
   a first semiconductor layer extending in a second direction intersecting the first direction, the first semiconductor layer being between the first gate electrode layer and the second gate electrode layer in a third direction intersecting the first and second directions;
   a second semiconductor layer extending in the second direction, the second semiconductor layer being between the first semiconductor layer and the second gate electrode layer in the third direction and separated from the first semiconductor layer;
   a third semiconductor layer between the first gate electrode layer and the second gate electrode layer in the third direction, the third semiconductor layer extending in the second direction and being spaced from the first semiconductor layer in the first direction by a first gap;
   a first charge trapping layer between the first gate electrode layer and the first semiconductor layer;

a second charge trapping layer between the second gate electrode layer and the second semiconductor layer; and a third charge trapping layer between the first gate electrode layer and the third semiconductor layer.

2. The semiconductor storage device according to claim 1, wherein the first charge trapping layer and the third charge trapping layer are separated from each other in the first direction by the first gap.

3. The semiconductor storage device according to claim 1, wherein the first gap is between the first gate electrode layer and the second gate electrode layer in the third direction.

4. The semiconductor storage device according to claim 1, further comprising:
a fourth semiconductor layer between the third semiconductor layer and the second gate electrode layer in the third direction, the fourth semiconductor layer being separated from the third semiconductor layer, extending in the second direction and spaced from the second semiconductor layer in the first direction by a second gap; and
a fourth charge trapping layer between the second gate electrode layer and the fourth semiconductor layer.

5. The semiconductor storage device according to claim 4, further comprising:
a third gate electrode layer that extends in the first direction, the third gate electrode layer being spaced from the first gate electrode layer in the second direction by the first gap; and
a fifth charge trapping layer between the third gate electrode layer and the first semiconductor layer.

6. The semiconductor storage device according to claim 4, further comprising:
a first insulating layer between the first semiconductor layer and the second semiconductor layer;
a second insulating layer between the third semiconductor layer and the fourth semiconductor layer; and
a third insulating layer between the first insulating layer and the second insulating layer, the third insulating layer having a chemical composition differing from that of the first insulating layer and that of the second insulating layer and being separated from the first gate electrode layer by the first gap and from the second gate electrode layer by the second gap.

7. The semiconductor storage device according to claim 6, wherein
the first insulating layer and the second insulating layer are silicon oxide, and
the third insulating layer is silicon nitride.

8. The semiconductor storage device according to claim 7, further comprising:
a third gate electrode layer extending in the first direction, the third gate electrode layer being spaced from the first gate electrode layer in the second direction by the first gap; and
a fourth gate electrode layer extending in the first direction, the fourth gate electrode layer being spaced from the second gate electrode layer in the second direction by the second gap, wherein
the third insulating layer includes:
a first portion between the first gate electrode layer and the second gate electrode layer,
a second portion between the third gate electrode layer and the fourth gate electrode layer, and
a third portion between the first portion and the second portion, and a width of the first portion in the third direction is greater than a width of the third portion in the third direction.

9. The semiconductor storage device according to claim 6, further comprising:
a third gate electrode layer extending in the first direction, the third gate electrode layer being spaced from the first gate electrode layer in the second direction by the first gap; and
a fourth gate electrode layer extending in the first direction, the fourth gate electrode layer being spaced from the second gate electrode layer in the second direction by the second gap, wherein
the third insulating layer includes:
a first portion between the first gate electrode layer and the second gate electrode layer,
a second portion between the third gate electrode layer and the fourth gate electrode layer, and
a third portion between the first portion and the second portion, and
a width of the first portion in the third direction is greater than a width of the third portion in the third direction.

10. The semiconductor storage device according to claim 1, further comprising:
a third gate electrode layer that extends in the first direction, the third gate electrode being spaced from the first gate electrode layer in the second direction by the first gap.

11. A semiconductor storage device, comprising:
a first gate electrode layer extending in a first direction;
a second gate electrode layer extending in the first direction;
a third gate electrode layer that extends in the first direction and is separated from the first gate electrode layer by a first gap;
a first semiconductor layer between the first gate electrode layer and the second gate electrode layer, the first semiconductor layer being between the third gate electrode layer and the second gate electrode layer and extending in a second direction that intersects the first direction;
a second semiconductor layer between the first semiconductor layer and the second gate electrode layer, the second semiconductor layer being separated from the first semiconductor layer and extending in the second direction;
a third semiconductor layer between the first gate electrode layer and the second gate electrode layer and between the third gate electrode layer and the second gate electrode layer, the third semiconductor layer being in the first direction from the first semiconductor layer, extending in the second direction, and separated from the first semiconductor layer by a first gap;
a fourth semiconductor layer between the third semiconductor layer and the second gate electrode layer, the fourth semiconductor layer being separated from the third semiconductor layer, extending in the second direction, and separated from the second semiconductor layer by a second gap;
a first charge trapping layer between the first gate electrode layer and the first semiconductor layer;
a second charge trapping layer between the second gate electrode layer and the second semiconductor layer;
a third charge trapping layer between the first gate electrode layer and the third semiconductor layer;
a fourth charge trapping layer between the second gate electrode layer and the fourth semiconductor layer; and a fifth charge trapping layer between the third gate electrode layer and the first semiconductor layer.

12. The semiconductor storage device according to claim 11, wherein the first charge trapping layer and the third charge trapping layer are separated by the first gap.

13. The semiconductor storage device according to claim 11, wherein the first gate electrode layer and the second gate electrode layer are separated by the first and second gaps.

14. The semiconductor storage device according to claim 11, further comprising:
   a first insulating layer between the first semiconductor layer and the second semiconductor layer;
   a second insulating layer between the third semiconductor layer and the fourth semiconductor layer; and
   a third insulating layer between the first insulating layer and the second insulating layer and having a chemical composition differing from that of the first insulating layer and that of the second insulating layer, the third insulating layer being separated from the first gate electrode layer by the first gap and from the second gate electrode layer by the second gap.

15. The semiconductor storage device according to claim 14, wherein
   the first insulating layer and the second insulating layer are silicon oxide, and
   the third insulating layer is silicon nitride.

16. The semiconductor storage device according to claim 15, further comprising:
   a fourth gate electrode layer that extends in the first direction, the fourth gate electrode being in the second direction from the second gate electrode layer and separated from the second gate electrode layer by the second gap, wherein
   the third insulating layer includes:
      a first portion between the first gate electrode layer and the second gate electrode layer,
      a second portion between the third gate electrode layer and the fourth gate electrode layer, and
      a third portion between the first portion and the second portion, and
   a width of the first portion in a third direction intersecting the first and second directions is greater than a width of the third portion in the third direction.

17. The semiconductor storage device according to claim 14, further comprising:
   a fourth gate electrode layer that extends in the first direction, the fourth gate electrode being in the second direction from the second gate electrode layer and separated from the second gate electrode layer by the second gap, wherein
   the third insulating layer includes:
      a first portion between the first gate electrode layer and the second gate electrode layer,
      a second portion between the third gate electrode layer and the fourth gate electrode layer, and
      a third portion between the first portion and the second portion, and
   a width of the first portion in a third direction intersecting the first and second directions is greater than a width of the third portion in the third direction.

18. The semiconductor storage device according to claim 17, wherein a width of the second portion in the third direction is greater than the width of the third portion in the third direction.

19. The semiconductor storage device according to claim 17, wherein the first gap and second gap are void space.

20. The semiconductor storage device according to claim 11, wherein the first gap and second gap are void space.

* * * * *